United States Patent
Rhodes

(10) Patent No.: US 10,804,941 B2
(45) Date of Patent: Oct. 13, 2020

(54) MICROWAVE SWITCHED MULTIPLEXER AND A MOBILE TELECOMMUNICATIONS DEVICE INCLUDING SUCH A MULTIPLEXER

(71) Applicant: ISOTEK MICROWAVE LIMITED, Yorkshire (GB)

(72) Inventor: David Rhodes, Menston Yorkshire (GB)

(73) Assignee: ISOTEK MICROWAVE LIMITED, Yorkshire (GB)

( * ) Notice: Subject to any disclaimer, the term of this patent is extended or adjusted under 35 U.S.C. 154(b) by 256 days.

(21) Appl. No.: 16/326,612

(22) PCT Filed: Sep. 8, 2016

(86) PCT No.: PCT/GB2016/052768
§ 371 (c)(1),
(2) Date: Feb. 19, 2019

(87) PCT Pub. No.: WO2017/042559
PCT Pub. Date: Mar. 16, 2017

(65) Prior Publication Data
US 2019/0222235 A1    Jul. 18, 2019

(30) Foreign Application Priority Data

Sep. 8, 2015  (GB) .................................... 1515922.1
Oct. 26, 2015  (GB) .................................... 1518890.7
Oct. 26, 2015  (GB) .................................... 1518893.1

(51) Int. Cl.
*H04B 1/00* (2006.01)
*H03H 7/46* (2006.01)
(Continued)

(52) U.S. Cl.
CPC ............ *H04B 1/006* (2013.01); *H01P 1/2136* (2013.01); *H03H 7/465* (2013.01); *H04B 1/0057* (2013.01);
(Continued)

(58) Field of Classification Search
CPC ........ H04B 1/006; H04B 1/69; H04B 1/0057; H05B 6/705; H01P 1/2136; H01P 1/213;
(Continued)

(56) References Cited

U.S. PATENT DOCUMENTS 6,806,791 B1   10/2004  Wang et al.
2006/0114082 A1   6/2006  Hidalgo Carpintero et al.
(Continued)

FOREIGN PATENT DOCUMENTS

CA    1194157 A    9/1985

OTHER PUBLICATIONS

UK Intellectual Property Office Search Report issued in UK Application No. GB1515922.1 dated Jan. 11, 2016.
(Continued)

*Primary Examiner* — Jung H Park
(74) *Attorney, Agent, or Firm* — Quinn IP Law

(57) ABSTRACT

A microwave switched multiplexer having a bandpass At between frequencies $f_1$ and $f_2$, $\Delta f = f_1 - f_2$, the multiplexer comprising n signal channels, where n>1, each signal channel having a signal bandpass at a center frequency within M, the center frequencies of the signal channels being equally spaced apart by $\Delta f/n$; each signal channel comprising (a) a switch having first, second and third ports, the switch being adapted to be switched between a transmit position in Which the first port is connected to the second port, a receive position in which the first port is connected to the third port and an off position in which the first port is not connected to either second or third ports; (b) a common line extending
(Continued)

from an antenna end to the first port, the common; line comprising an input resonator and a center resonator connected together in cascade, the center resonator being coupled between the resonator and the first port.

20 Claims, 23 Drawing Sheets

(51) Int. Cl.
| | |
|---|---|
| *H01P 1/213* | (2006.01) |
| *H04B 1/69* | (2011.01) |
| *H05B 6/70* | (2006.01) |
| *H03H 9/70* | (2006.01) |
| *H03H 7/01* | (2006.01) |
| *H03H 9/72* | (2006.01) |
| *H03H 9/17* | (2006.01) |

(52) U.S. Cl.
CPC .............. *H04B 1/69* (2013.01); *H05B 6/705* (2013.01); *H03H 7/0161* (2013.01); *H03H 9/171* (2013.01); *H03H 9/706* (2013.01); *H03H 9/725* (2013.01)

(58) Field of Classification Search
CPC ......... H01P 1/208; H01P 1/203; H03H 7/465; H03H 9/725; H03H 7/0161; H03H 9/171; H03H 9/706; H03H 9/70
See application file for complete search history.

(56) References Cited

U.S. PATENT DOCUMENTS

| | | | |
|---|---|---|---|
| 2014/0167877 A1 | 6/2014 | Shimizu et al. | |
| 2015/0133067 A1 | 5/2015 | Chang et al. | |
| 2016/0277001 A1* | 9/2016 | Guyette | ................... H03H 7/46 |
| 2019/0173145 A1* | 6/2019 | Abdo | ..................... H03K 17/92 |

OTHER PUBLICATIONS

UK Intellectual Property Office Search Report issued in UK Application No. GB1518893.1.1 dated Apr. 29, 2016.
UK Intellectual Property Office Search Report issued in UK Application No. GB1615248.0 dated Feb. 28, 2017.
International Search Report issued in International Application No. PCT/GB2016/052768 dated Dec. 7, 2016.
Shang Xiaobang et al., Novel Multiplexer Topologies Based on All-Resonator Structures, IEEE Transactions on Microwave Theory and Techniques, IEEE Service Center, vol. 61, No. 11, pp. 3838-3845, Piscataway, NJ, United States.
Clark T-C Nguyen, MEMS-based RF channel selection for true software-defined cognitive radio and low-power sensor communications, IEEE Communications Magazine, vol. 51, No. 4, Apr. 1, 2013, pp. 110-119, Piscataway, United States.

* cited by examiner

MICROWAVE SWITCHED MULTIPLEXER AND A MOBILE TELECOMMUNICATIONS DEVICE INCLUDING SUCH A MULTIPLEXER

CROSS REFERENCE TO RELATED APPLICATIONS

This application claims the benefit of PCT Patent Application No. PCT/GB2016/052768 filed on Sep. 8, 2016, entitled "A MICROWAVE SWITCHED MULTIPLEXER AND A MOBILE TELECOMMUNICATIONS DEVICE INCLUDING SUCH A MULTIPLEXER," which is incorporated by reference in its entirety in this disclosure.

TECHNICAL FIELD OF THE INVENTION

The present invention relates to a microwave switched multiplexer. More particularly, but not exclusively, the present invention relates to a microwave switched multiplexer comprising a plurality of signal channels, each signal channel comprising an input resonator, a center resonator and then a switch, the two outputs of which are connected to transmit and receive channels, each of the transmit and receive channels comprising an output resonator, the two output resonators have the same admittances, the ratios of the admittances of the input, center and output resonators being in the ratio $\pi/2:4x/\pi:\pi 2$, where x b in the range 0.9 to 1.1. In a further aspect the present invention relates to a mobile telecommunications device such as a mobile phone including such a multiplexer.

BACKGROUND OF THE INVENTION

There are an increasing number of geographic specific microwave frequency bands used by mobile telecommunications systems. If a mobile telecommunications handset is to be used in a plurality of different geographical areas then the handset must to be able to selectively transmit and receive microwave signals in a plurality of different microwave frequency bands. The mobile handset can identify the transmit and receive signal bands used by the telecommunications system covering its current location and then transmit and receive in those bands.

Conventional handsets typically comprise a plurality of diplexers, each corresponding to a frequency band. The antenna or transmitter is connected to the appropriate diplexer (or diplexers) if the handset wishes to transmit or receive in a particular signal band.

Such an arrangement has a number of drawbacks. Perhaps the most significant of these drawbacks is that interband aggregation between adjacent frequency bands (to produce a single band of larger width in frequency) is almost impossible to implement. The frequency selective diplexers have increasing group delay and loss at the center point between bands. Hence, if two diplexers adjacent in frequency are switched on to produce an aggregate band increased loss and group delay occurs at the center of the aggregate band.

One method used to overcome this problem is to power divide between alternate channels and recombine at the output. However, this technique increases the overall loss by 6 dB. Also, the rapid change in group delay at the crossover frequency makes phase tracking of devices (a necessity in interferometer systems) extremely difficult.

BRIEF SUMMARY OF THE INVENTION

The present invention seeks to overcome the problems of the prior art.

Accordingly, in a first aspect, the present invention provides a microwave switched multiplexer having a bandpass $\Delta f$ between frequencies $f_1$ and $f_2$, $\Delta f = f_1 - f_2$, the multiplexer comprising n signal channels, where n>1, each signal channel having a signal bandpass at a center frequency within $\alpha f$, the center frequencies of the signal channels being equally spaced apart by $\Delta f/n$;

each signal channel comprising
(a) a switch having first, second and third ports, the switch being adapted to be switched between a transmit position in which the first port is connected to the second port, a receive position in which the first port is connected to the third port and an off position in which the first port is not connected to either second or third ports;
(b) a common line extending from an antenna end to the first port, the common line comprising an input resonator and a center resonator connected together in cascade, the center resonator being coupled between the input resonator and the first port;
(c) a transmit line extending between the second port and a transmit end, the transmit line comprising an output resonator, the output resonator being connected in cascade with the input and center resonators when the switch is in the transmit position;
(d) a receive line extending between the third port and a receive end, the receive line comprising an output resonator, the output resonator being connected in cascade with the input and center resonators when the switch is in the receive position;
the admittances of the two output resonators being equal;
the admittance of the input resonator, center resonator and output resonator being in the ratio $$\pi/2:4x/\pi:\pi/2$$

where x is in the range 0.9 to 1.1
wherein for at least two signal channels adjacent in frequency the antenna ends are connected to a common antenna node and at least one of (a) the receive ends are connected to a common receive node or (b) the transmit ends are connected to a common transmit node;
the admittances of the input, center and output resonators having absolute values such that for every signal channel when the switch for that channel is in the transmit or receive position and the switches for all other channels are in the off position, the width of tie signal bandpass of the signal channel is substantially $\Delta f/n$ Preferably for the at least two signal channels the receive ends are connected to a common receive node and the transmit ends are connected to a common transmit node.

Preferably for every signal channel the antenna ends are connected to a common antenna node, the transmit ends are connected to a common transmit node and the receive ends are connected to a common receive node.

Preferably x is in the range 0.95 to 1.05, more preferably 0.97 to 1.03, more preferably 0.99 to 1.01

Preferably at least one of input, center and output resonators is an FBAR or SAW resonator.

Preferably the antenna node is connected to an antenna.

Preferably the antenna node comprises an antenna resonator.

Preferably the ratio of the admittance of the antenna resonator to the input resonator is $$y/n:\pi/2$$

where y is in the range 0.5 to 1.5

Preferably y is in the range 0.8 to 1.2, more preferably 0.9 to 1.1, more preferably 0.95 to 1.05.

Preferably the transmit node is connected to a transmitter, the transmitter being adapted to provide a microwave signal between frequencies $f_1$ and $f_2$ Preferably the transmit node comprises a transmitter resonator, the ratio of the admittances of the transmitter resonator to the output resonator being $$y/n:\pi/2$$

where y is in the range 0.5 to 1.5, preferably 0.8 to 1.2, more preferably 0.9 to 1.1, more preferably 0.95 to 1.05.

Preferably the receive node comprises a receiver resonator, the ratio of the admittance of the receiver resonator to the output resonator being $$y/n:\pi/2$$

where y is in the range 0.5 to 1.5, preferably 0.5 to 1.2, more preferably 0.9 to 1.1, more preferably 0.95 to 1.05.

Preferably the microwave switched resonator further comprises, a controller connected to the switches for switching the switches between states.

In a further aspect of the invention there is provided a mobile telecommunications device comprising at least one microwave switched multiplexer as claimed in any one of claims 1 to 13.

BRIEF DESCRIPTION OF THE DRAWINGS

The present invention will now be described by way of example only and not in any limitative sense with reference to the accompanying drawings in which

FIG. 5a shows insertion loss and return loss for a 20 channel multiplexer not according to the invention with all channels switched on;

FIG. 5b shows the insertion loss and group delay for the multiplexer of FIG. 5a;

FIG. 7a shows the insertion loss and return loss for the multiplexer of FIG. 5a with one channel switched on;

FIG. 7b shows the group delay for the multiplexer of FIG. 5a with one channel switched on;

FIG. 9a shows the insertion loss and return loss for the multiplexer of FIG. 5a with three channels switched on;

FIG. 9b shows the group delay for the multiplexer of FIG. 5a with three channels switched on;

FIG. 11a shows the insertion loss and return loss for the multiplexer of FIG. 5a with two channels switched on;

FIG. 11b shows the group delay for the multiplexer of FIG. 5a with two channels switched on;

FIG. 13a shows the insertion loss and return loss for the multiplexer of FIG. 5a with four channels switched on;

FIG. 13b shows the group delay for the multiplexer of FIG. 5a with four channels switched on;

BRIEF DESCRIPTION OF THE INVENTION

Figure 1:
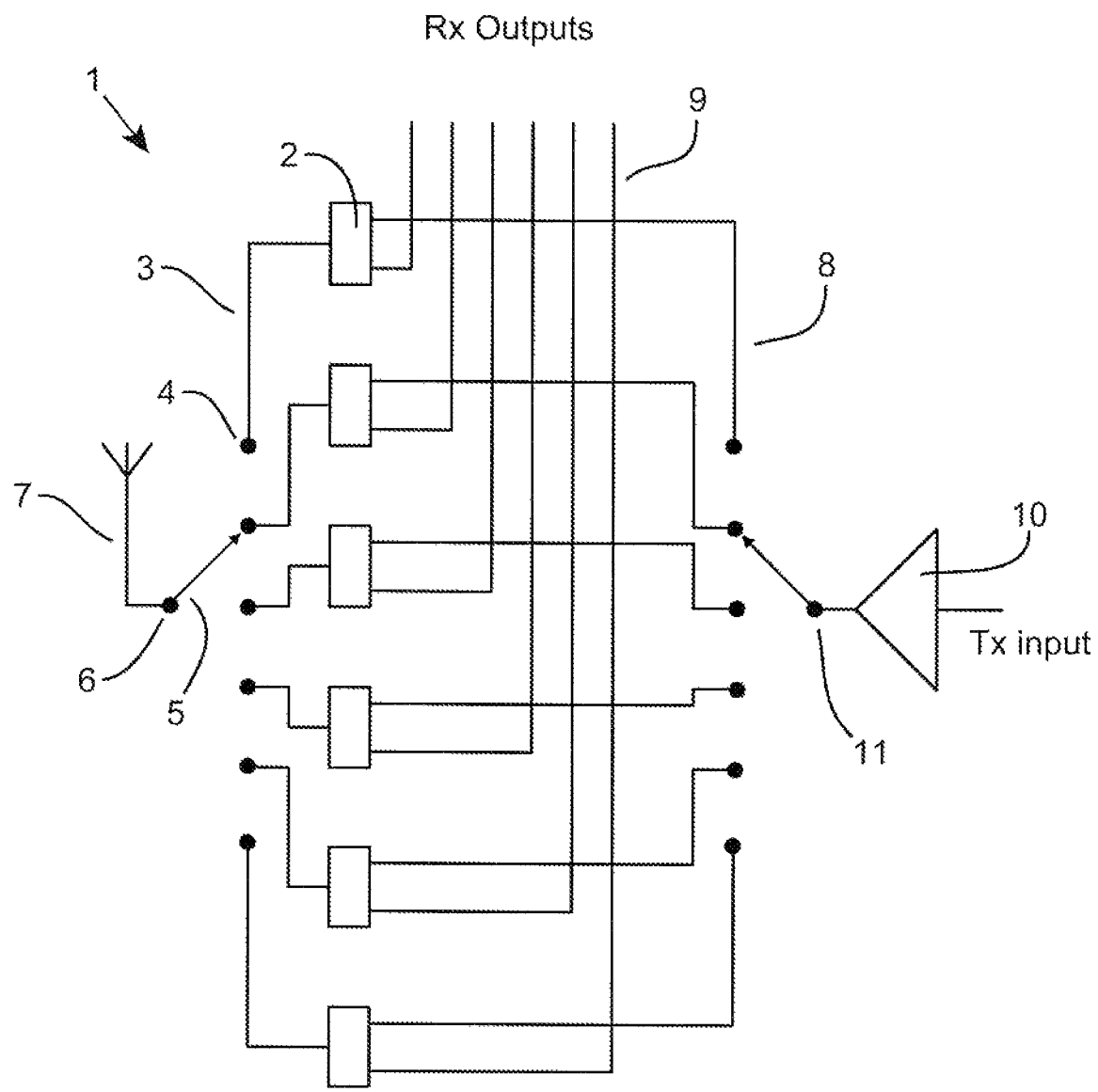
FIG. 1 shows a simplified representation of a known microwave switched multiplexer.

Shown in FIG. 1 is a known microwave switched multiplexer 1. The multiplexer 1 comprises a plurality of diplexers 2, one for each frequency band. Each diplexer 2 is connected via a signal line 3 to a port 4 of a switch 5. The common port 6 of the switch 5 is connected to an antenna 7. Extending from each diplexer 2 is a transmission line 8 and a receive line 9 which connect to common transmitters 10 and receivers respectively via switches 11 as shown. Only the common transmitter 10 and transmitter switch 11 are shown for clarity.

In order to transmit in a particular frequency band the switch 1 to the transmitter 10 is set to connect the transmitter 10 to the appropriate diplexer 2. Similarly, the switch 5 to the antenna 7 is set to conned the antenna 7 to the same diplexer 2. To receive a signal the same procedure is followed using the receiver and receiver switch.

Such known multiplexers 1 have a number of drawbacks. Firstly, an additional diplexer 2 Is required for every frequency band that is to be covered. Secondly, as the number of diplexers 2 increases the switches 5,11 become more complex, so degrading performance. Thirdly, in the simplified architecture shown in FIG. 1 only one diplexer 2 can be employed at any one time. If one wishes to employ a plurality of diplexers 2 simultaneously the switching circuitry becomes far more complex and again performance degrades. Finally, and perhaps most significantly, with such a microwave switched multiplexer 1 it is almost impossible to aggregate adjacent (in frequency) bands together. If one connects to two diplexers 2 having adjacent bands the resulting aggregate band would be essentially unusable having increases loss and group delay at the cross over point of the two bands making up the aggregate band.

The operation of a microwave switched multiplexer according to the invention may best be explained by reference to the behaviour of a length of transmission line matched to load and source resistances (normalised to 1 Ohm). The transmission line may be viewed as a filter having no toss and constant group delay (linear phase) at all frequencies.

Such a transmission line can be defined by a transfer matrix—

$$[T] = \begin{bmatrix} c & s \\ s & c \end{bmatrix}$$

Where $c = \cos h\,(\pi p)$ and $s = \sin h\,(\pi p)$, where p is the normalised complex frequency variable.

The reflection coefficient $S_{11}(p)$ and the transmission coefficient $S_{12}(p)$ are defined in terms of even $Y_e(p)$ and odd $Y_o(p)$ admittances of the network as $$S_{11}(p) = \frac{1 - Y_e(p)Y_o(p)}{(1+Y_e(p)) * (1+Y_o(p))}$$

and $$S_{12}(p) = \frac{Y_e(p) - Y_o(p)}{(1+Y_e(p)) * (1+Y_o(p))}$$

Where from the above one has $$Y_e(p) = \tanh\left(\frac{\pi p}{2}\right)$$
$$Y_o(p) = \coth\left(\frac{\pi p}{2}\right)$$

And hence $S_{11}(p) = 0$ and $S_{12}(p) = e^{-\pi p}$

Hence, the circuit is matched at all frequencies with a linear phase of $\pi\omega(p=j\omega)$.

To form the equivalent parallel connection of circuit elements a partial fraction expansion of $Y_e(p)$ and $Y_o(p)$ is performed—

Hence, $$Y_o(p) = \coth\left(\frac{\pi p}{2}\right)$$
$$= \sum_{r=-\infty}^{r=+\infty} \frac{Ar}{p + j2r}$$
$$= \frac{2}{\pi}\sum_{r=-\infty}^{r=+\infty} \frac{1}{p + j2r}$$

Figure 2:
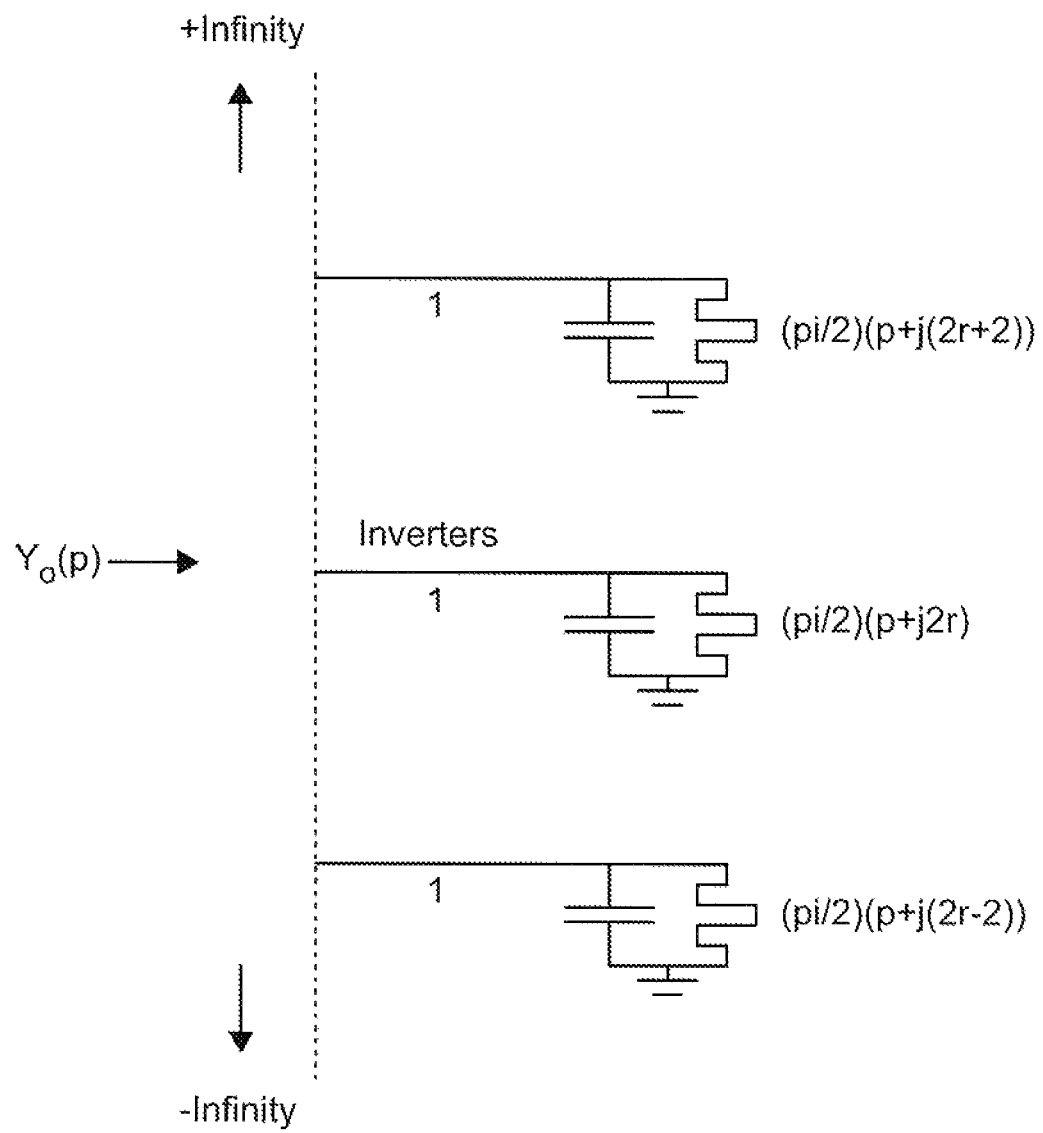
FIG. 2 shows an equivalent circuit for Yo(p) of a transmission line.

Thus, the equivalent circuit for $Y_o(p)$ is as shown in FIG. 2

For $Y_e(p)$, $$Y_e(p) = \tanh(p) = \frac{2}{\pi}\sum_{r=-\infty}^{r=+\infty} \frac{1}{p + j(2r-1)}$$

This may be decomposed into the sum of two infinite series as $$Y_e(p) = \frac{1}{\pi}\sum_{r=-\infty}^{r=+\infty}\left[\frac{1}{p+j(2r-1)} + \frac{1}{p+j(2r+1)}\right]$$
$$= \frac{2}{\pi}\sum_{r=-\infty}^{r=+\infty}\left[\frac{p+2jr}{(p+2jr)^2 + 1}\right]$$
$$= \frac{2}{\pi}\sum_{r=-\infty}^{r=+\infty}\left[\frac{1}{(p+j2r) + \frac{1}{(p+j2r)}}\right]$$

Figure 3:
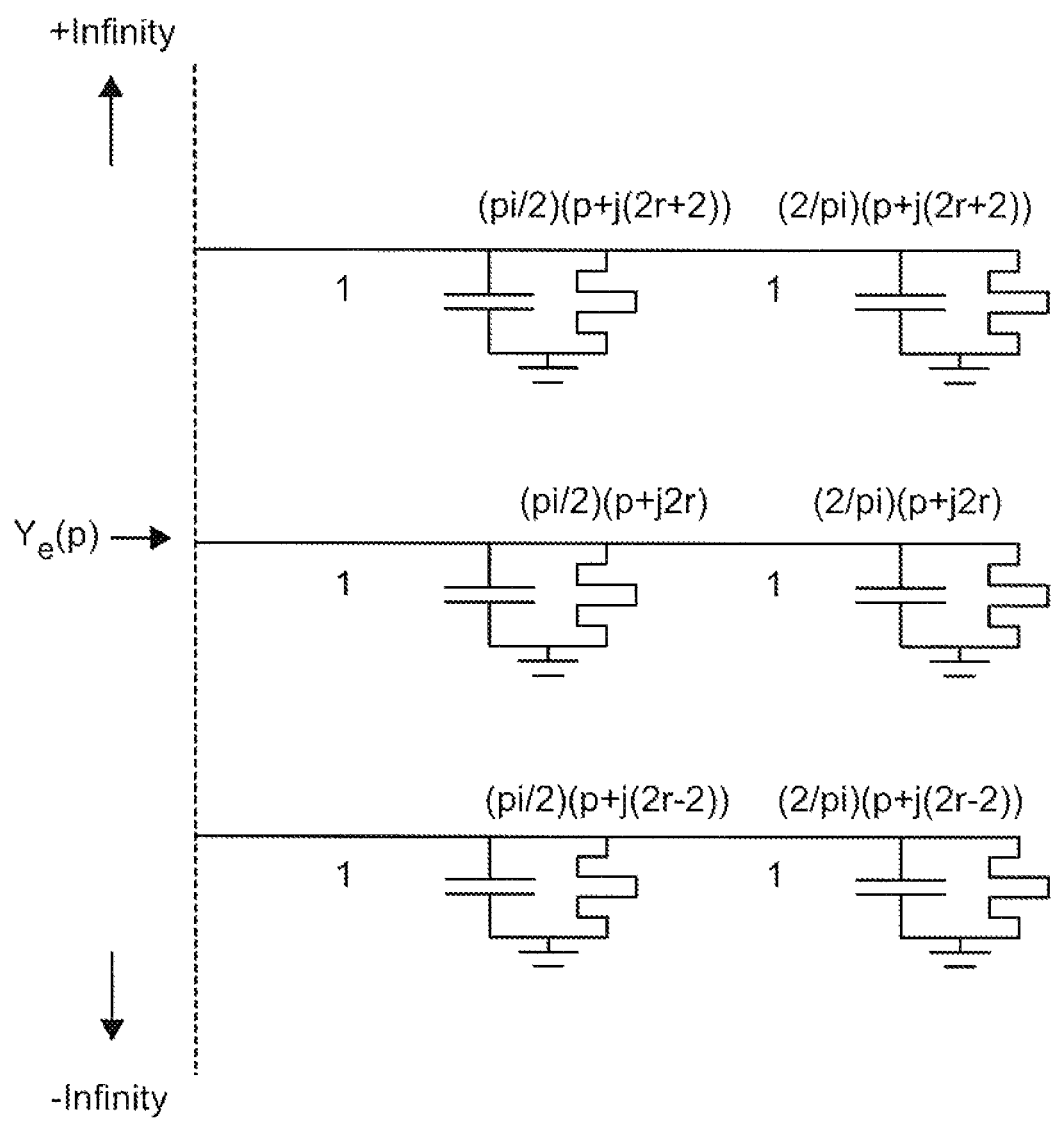
FIG. 3 shows an equivalent circuit for Ye(p) of a transmission line.

Thus, the equivalent circuit for $Y_e(p)$ is as shown in FIG. 3.

Figure 4:
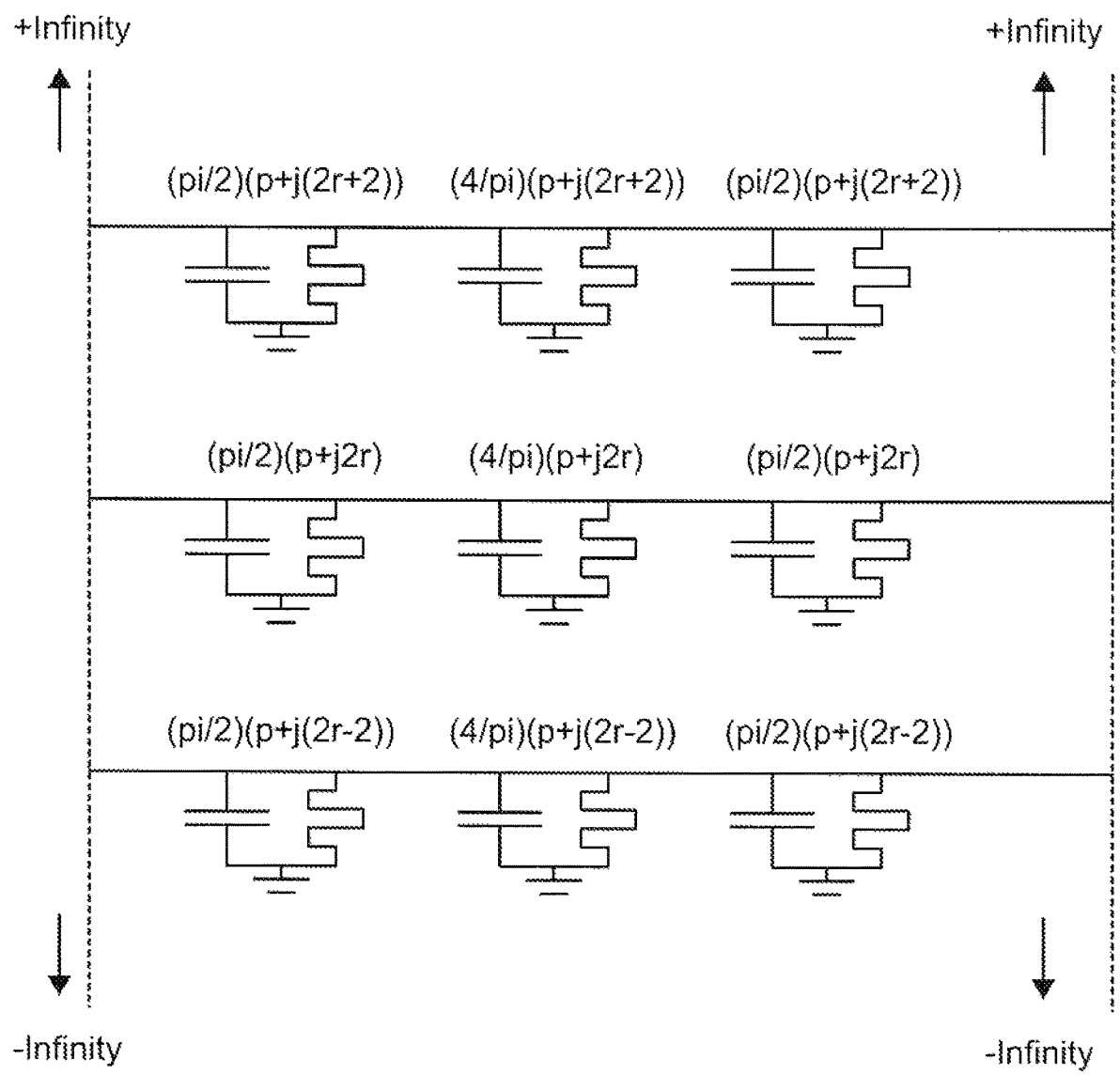
FIG. 4 shows an equivalent circuit for a combination of Yo(p) and Ye(p) of a transmission line.

Combining the even and odd mode networks gives the circuit as shown in FIG. 4. The circuit of FIG. 4 which represents the transmission line can alternately be viewed as a multiplexer comprising an infinite number of signal channels equally spaced apart in frequency. Each signal channel comprises three resonators connected together in cascade, an input resonator coupled to an input waveguide for receiving the microwave signal, an output resonator coupled to an output waveguide and a center resonator connected between the two. The resonators are connected in cascade. In each signal channel the admittances of the resonators are in the ratio $\pi/2:4/\pi:\pi/2$ (and in fact have these absolute values in this normalised model). The admittances of equivalent resonators in each signal channel are the same (ie all input resonators have the same admittance, all center resonators have the same admittance and all output resonators have the same admittance). The signal channels are spaced equally apart in frequency. Whilst the signal channels are shown physically spaced apart the input resonators are each connected to a common signal input point. Similarly the output resonators are connected to a common signal output point.

This idealised multiplexer with an infinite number of signal channels has the property that it is matched at all frequencies and has a constant delay at all frequencies. To convert this multiplexer into a switched multiplexer some means of turning channels on and off is required. This could for example comprise a tuning mechanism connected to the central resonator of each signal channel which can be switched between 'on' and 'off' configurations. When in the 'on' configuration the resonant frequency of the associated central resonator in a signal channel is the same as that of the input and output resonators of that channel. When in the 'off' configuration the resonant frequency of the associated central resonator is remote from that of the input and output resonators of that channel such that the central resonator is effectively shorted out.

Independent of which signal channels ate switched on or off (a signal channel is said to be on if the tuning mechanism of the center resonator of the signal channel is in the on configuration and off if the tuning mechanism is in the off configuration) the odd mode admittance remains the same.

For the even mode admittance however if the central resonator is shorted that component of the even mode network becomes the same as the equivalent component of the odd mode network.

For a multiplexer with a finite number of signal channels the elements which make up the signal channels are identical to the elements in the infinite network. There is an important difference however. If there are n channels the multiplexer has a bandpass of 2n in frequency, with each signal channel having a signal bandpass of 2. The tuning mechanism when in the off state tunes the resonant frequency of the associated center resonator out of the bandpass of the multiplexer.

If the microwave switched multiplexer having a finite number of signal channels has a bandpass $\Delta f$ between $f_1$ and $f_2$ then the admittances of the resonators will still have the same ratios. However, the absolute values of the admittances need to be scaled such that the signal bandpass of each signal channel is $\Delta f/n$. The frequencies of the resonators are set such that the signal channels are spaced equally apart by $\Delta f/n$ so together covering the multiplexer bandpass $\Delta f$.

Figure 5A:
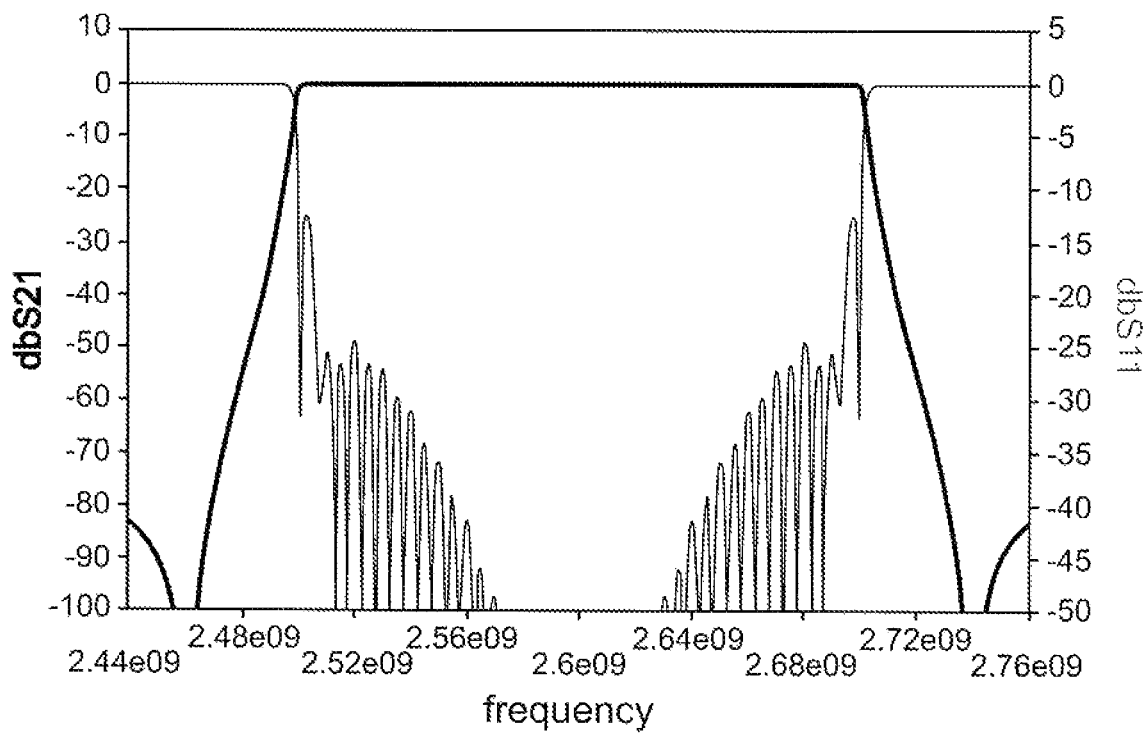
Figure 5B:
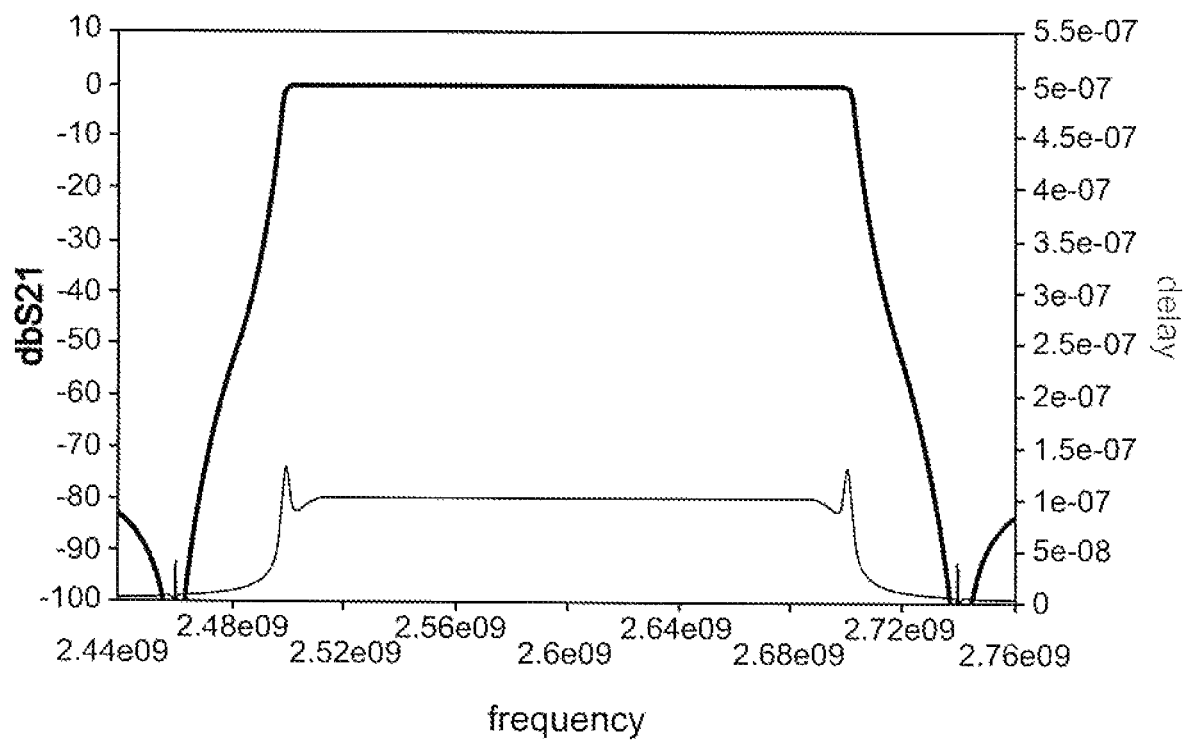

The insertion loss and return loss for such a multiplexer with all signal channels on is shown in FIG. 5(a). In FIG. 5(b) the insertion loss and group delay are plotted with a constant delay of 100 ns across most of the multiplexer bandpass. The switched microwave multiplexer has 20 signal channels. Each signal channel has a signal bandpass 10 MHz in width. The signal channels are equally separated from each other to cover the multiplexer bandpass between 2.5 and 2.7 GHz. The multiplexer further comprises additional resonant cavities connected as stubs at the common signal input and output points having resonant frequencies above and below the multiplexer band. The additional resonant cavities approximate to the behaviour inband of the missing n+1 to infinity channels. This multiplexer is not according to the invention and is included for explanatory purposes only. It is important to note that there is no change in loss or group delay at the cross over point from one channel to the next.

To illustrate what happens to the behaviour of such a multiplexer when signal channels are switched off only channels near to the center of the multiplexer bandpass are considered. With this simplification a theoretical response can be derived by still considering the multiplexer to have an infinite number of channels.

For One Channel Off—

$$Y_o(p) = \coth\left(\frac{\pi p}{2}\right)$$

$$Y_e(p) = \tanh\left(\frac{\pi p}{2}\right) - \frac{2}{\pi}\left[\frac{p}{p^2+1} - \frac{1}{p}\right]$$

$$= \tanh\left(\frac{\pi p}{2}\right) + \frac{2}{\pi}\left[\frac{1}{p(p^2+1)}\right]$$

which gives $$\frac{S_{11}(p)}{S_{12}(p)} = \frac{\frac{2}{\pi}\cosh^2\left(\frac{\pi p}{2}\right)}{p(p^2+1) - \frac{1}{\pi}\sinh(\pi p)}$$

Figure 6A:
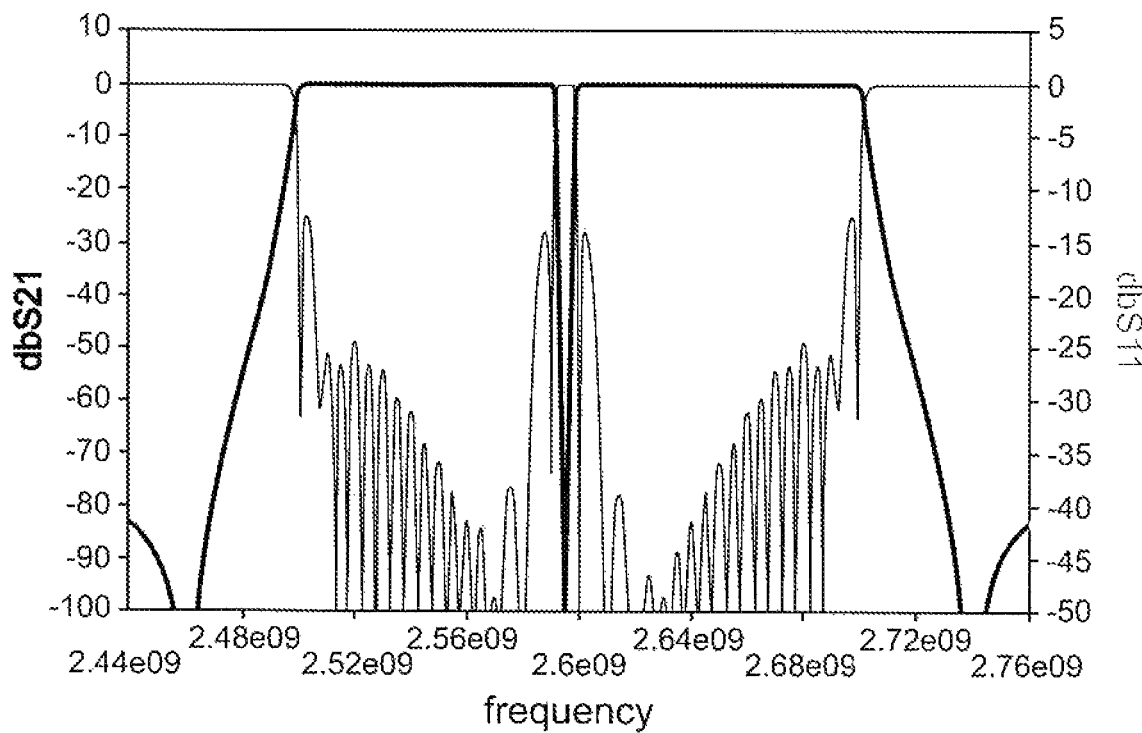
FIG. 6a shows the insertion loss and return loss for the multiplexer of FIG. 5a with one channel switched off.
Figure 6B:
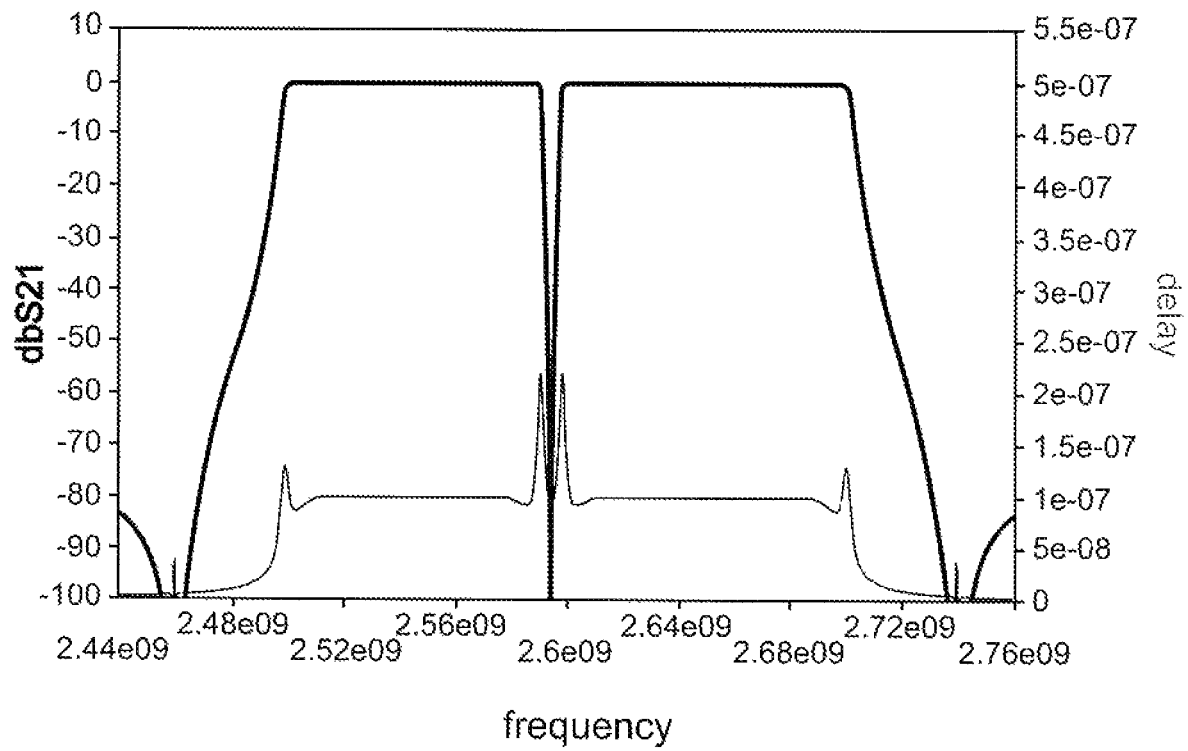
FIG. 6b shows the group delay for the multiplexer of FIG. 5a with one channel switched off.

Hence. $S_{11}(p)$ is zero at $p=+/-j$ and transmission loss $(S_{12}(p))$ has a third order zero at $p=0$. This response is shown in FIG. 6a with group delay in FIG. 6b. The passband begins at $p=+/-j$. One Channel On—

$$Y_o(p) = \coth\left(\frac{\pi p}{2}\right)$$

$$Y_e(p) = \coth\left(\frac{\pi p}{2}\right) - \frac{2}{\pi p(p^2+1)}$$

Hence, $$\frac{S_{11}(p)}{S_{12}(p)} = \frac{\pi p(p^2+1) - \sinh(\pi p)}{2\sinh^2\left(\frac{\pi p}{2}\right)}$$

Figure 7A:
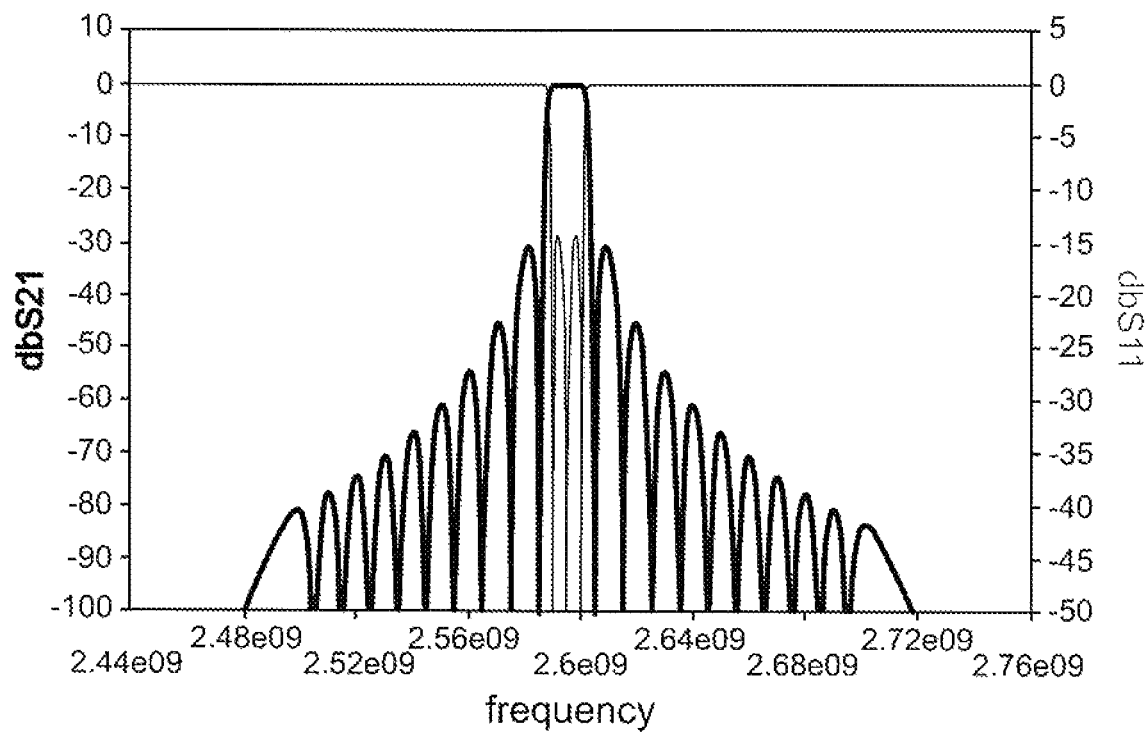
Figure 7B:
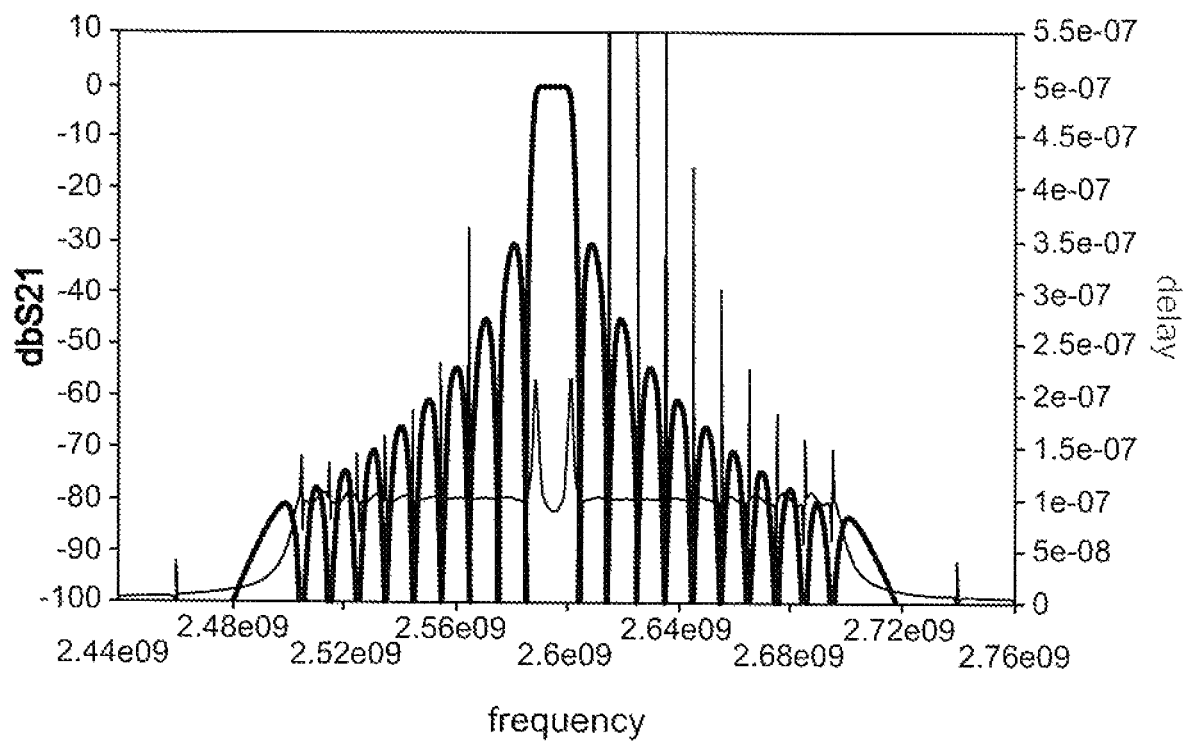

Since the numerator has a third order zero at $p=0$ and the denominator has a second order zero at $p=0$ then $S_{11}(0)=0$. Also, $S_{11}(+/-j)=0$ and $S_{12}(+/-2j)=0$. This response is shown in FIG. 7(a). The group delay is shown in FIG. 7b. In the passband which is between $P=+/-j$ the group delay is below 100 ns at the center of the band rising towards the band edge. The phase response therefore possesses a cubic variation relative to linear phase around the center frequency. The phase response and group delay are obtained from the fractions $1+Y_o(p)$ and $1+Y_e(p)$ in the denominator of equation 3. The phase response for $1+Y_o(p)$ is always linear phase (constant delay) for any switching state. However, for this case one should consider the phase of the factor $$1 + Y_e(p) = 1 + \coth\left(\frac{\pi p}{2}\right) - \frac{2}{\pi p(p^2+1)}$$

For $p=jw$ the phase is $\pi w/2$ for linear phase and hence the phase equals this value at $w=0$ and $w=+/-1$. Therefore the phase is an equidistant approximation to linear phase over the full passband between $w=+/-1$.

Three Channels Off—

For three adjacent channels turned off—

$$Y_o(p) = \coth\left(\frac{\pi p}{2}\right)$$

$$Y_e(p) = \tanh\left(\frac{\pi p}{2}\right) +$$

$$\frac{2}{\pi}\left[\frac{1}{p(p^2+1)} + \frac{1}{(p-j2)((p-j2)^2+1)} + \frac{1}{(p+j2)((p+j2)^2+1)}\right]$$

$$= \tanh\left(\frac{\pi p}{2}\right) + \frac{6(p^4-3p^2+12)}{\pi p(p^2+1)(p^2+4)(p^2+9)}$$

From which $$\frac{S_{11}(p)}{S_{12}(p)} = \frac{\cosh^2\left(\frac{\pi p}{2}\right)(p^4-3p^2+12)}{(p^4-3p^2+12)\sinh(\pi p) - \frac{\pi}{3}p(p^2+1)(p^2+4)(p^2+9)}$$

Figure 8A:
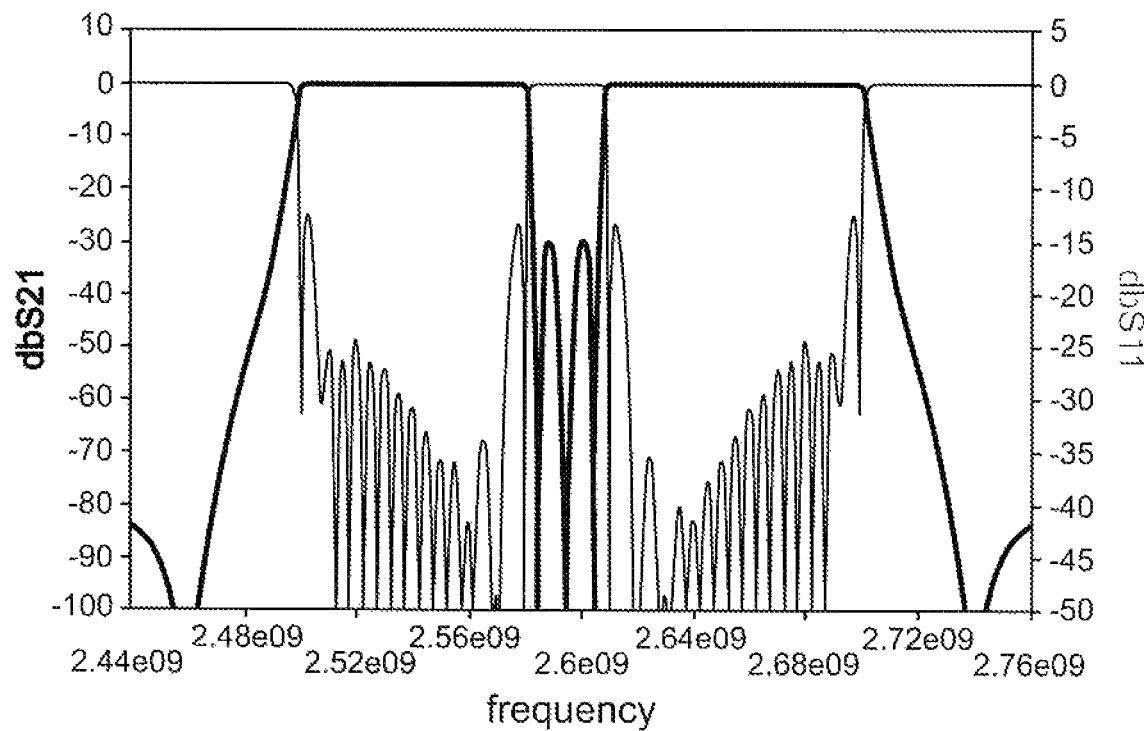
FIG. 8a shows the insertion loss and return loss for the multiplexer of FIG. 5a with three channels switched off.
Figure 8B:
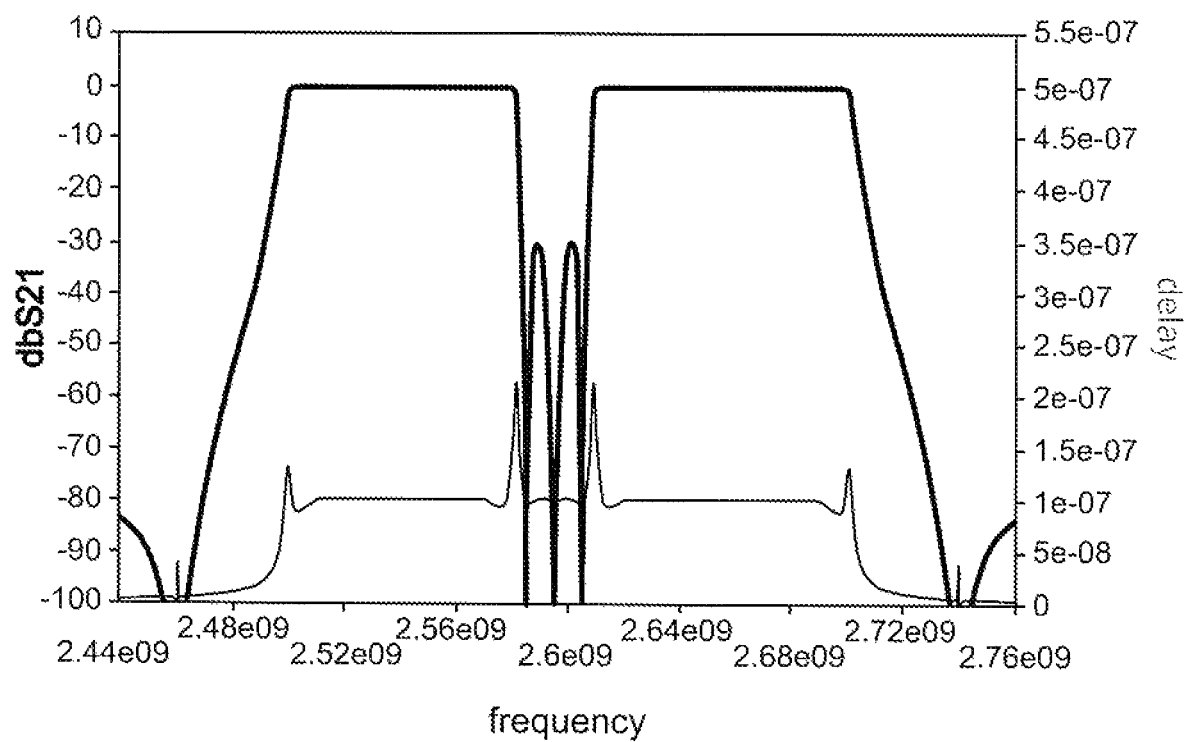
FIG. 8b shows the group delay for the multiplexer of FIG. 5a with three channels switched off.

Hence $S_{11}(p)$ is zero at $p=+/-j3$ and close inspection shows that $S_{12}(p)$ has a third order zero at $p=0$ and doubled ordered zeros at $p=+/-j2$. This is illustrated in FIG. 8a with the group delay in FIG. 8b.

Three Channels On—

For three adjacent channels turned on—

$$Y_o(p) = \coth\left(\frac{\pi p}{2}\right)$$

and $$Y_e(p) = \coth(p) - \frac{6(p^4 - 3p^2 + 12)}{\pi p(p^2+1)(p^2+4)(p^2+9)}$$

Which gives $$\frac{S_{11}(p)}{S_{12}(p)} = \frac{\frac{\pi}{3}p(p^2+1)(p^2+4)(p^2+9) - \sinh(\pi p)(p^4 - 3p^2 + 12)}{2\sinh^2\left(\frac{\pi p}{2}\right)(p^4 - 3p^2 + 12)}$$

Figure 9A:
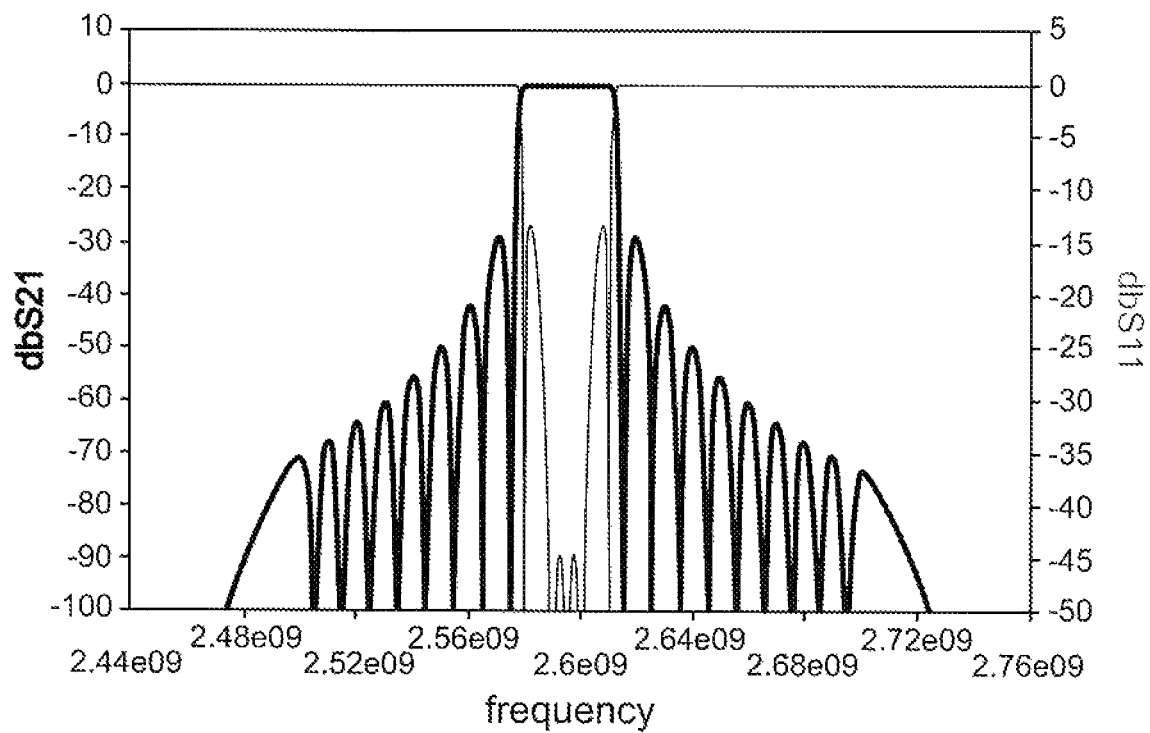
Figure 9B:
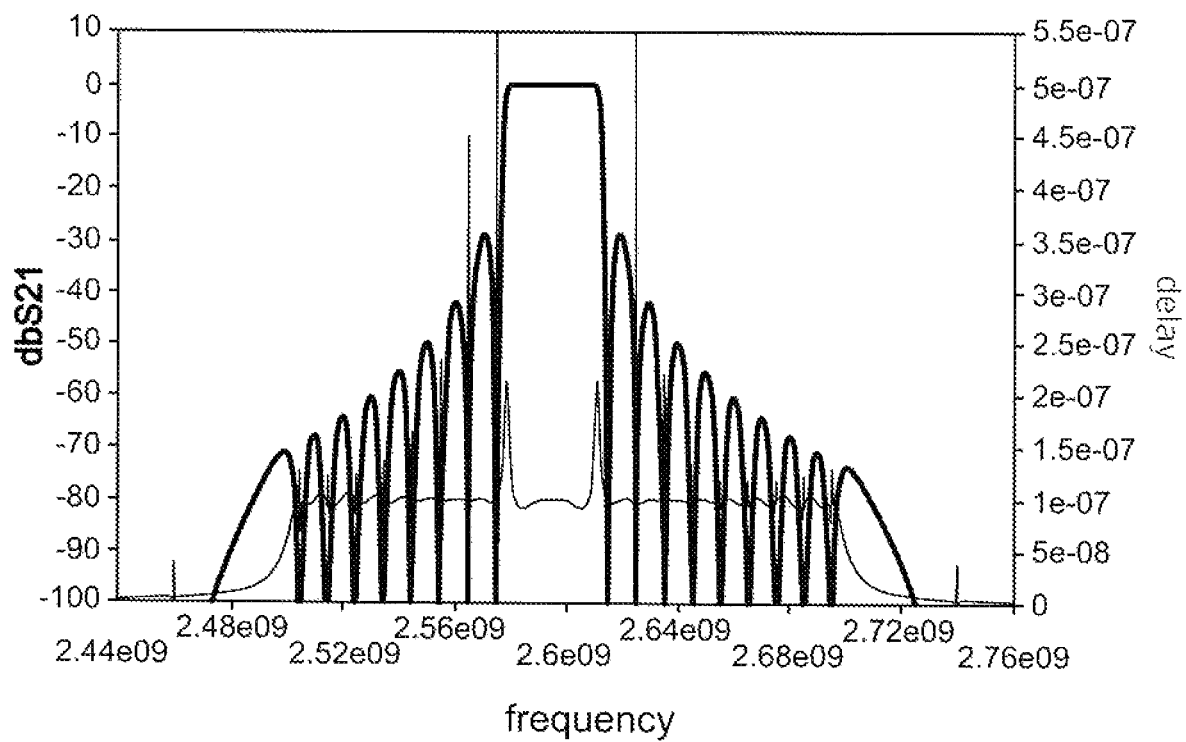

Close inspection shows that $S_{11}(p)$ has single ordered zeros at $p=0$, $p=+/-j3$ but double ordered zeros at $p=+/-j$. This response is shown in FIG. 9a. From Equation 15 it can be readily deduced that the phase response is an equidistant approximation to linear phase and equal at $p=0$, $+/-j2$, $+/-j3$ hence, equidistant over the entire passband. The corresponding group delay is shown in FIG. 9b.

Figure 10A:
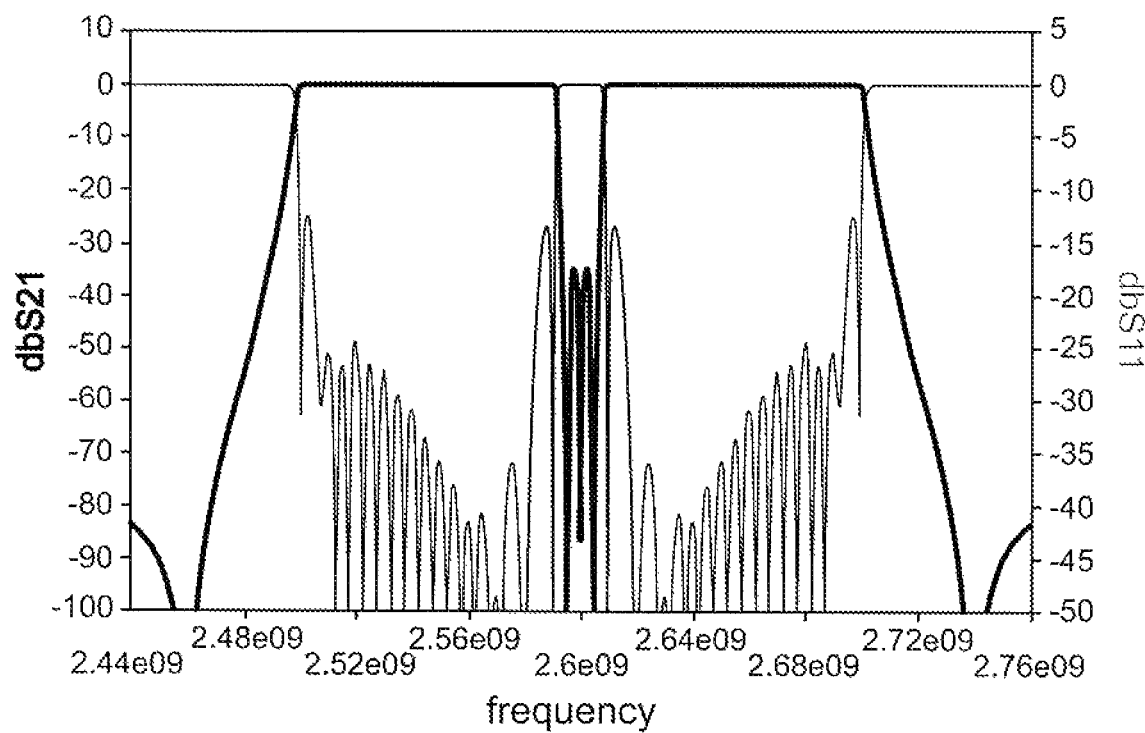
FIG. 10a shows the insertion loss and return loss for the multiplexer of FIG. 5a with two channels switched off.
Figure 10B:
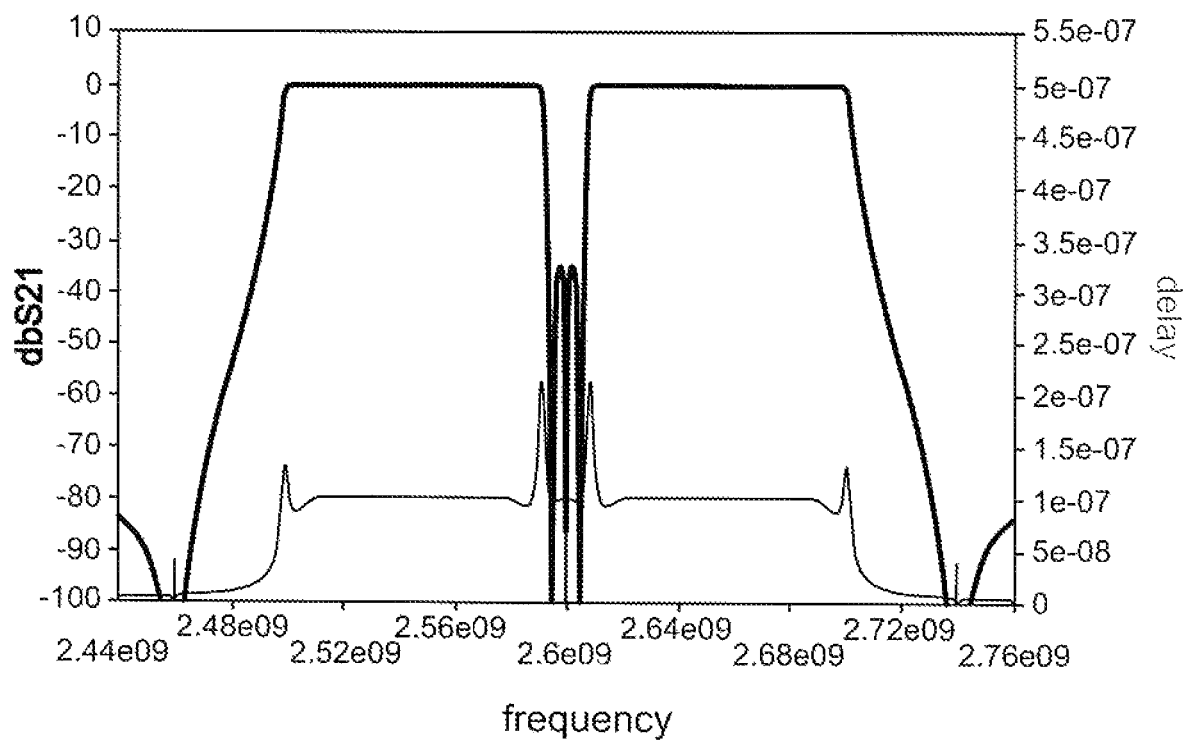
FIG. 10b shows the group delay for the multiplexer of FIG. 5a with two channels switched off.

To deal with the even degree cases (ie the multiplexer having an even number of Signal channels having signal bands arranged symmetrically about the center of the multiplexer passband) it is easier to perform the transformation $p \rightarrow p+j$ which produces symmetrical responses around $p=0$. For example for the second degree case one has. Two Channels Off—

$$\frac{S_{11}(p)}{S_{12}(p)} = \frac{2\sinh^2\left(\frac{\pi p}{2}\right)(p^2 - 2)}{\pi/2p(p^2+1)(p^2+4) + \sinh(\pi p)(p^2 - 2)}$$

Where $S_{11}(p)$ is zero at $p=+/-j2$ and $S_{12}(p)$ has a single ordered zero at $p=0$ and double ordered zeros at $p=+/-j$ as shown in FIGS. 10a and 10b. Two Channels On—

$$\frac{S_{11}(p)}{S_{12}(p)} = \frac{\pi/2p(p^2+1)(p^2+4) + \sinh(\pi p)(p^2 - 2)}{-2(p^2 - 2)\cosh^2\left(\frac{\pi p}{2}\right)}$$

Figure 11A:
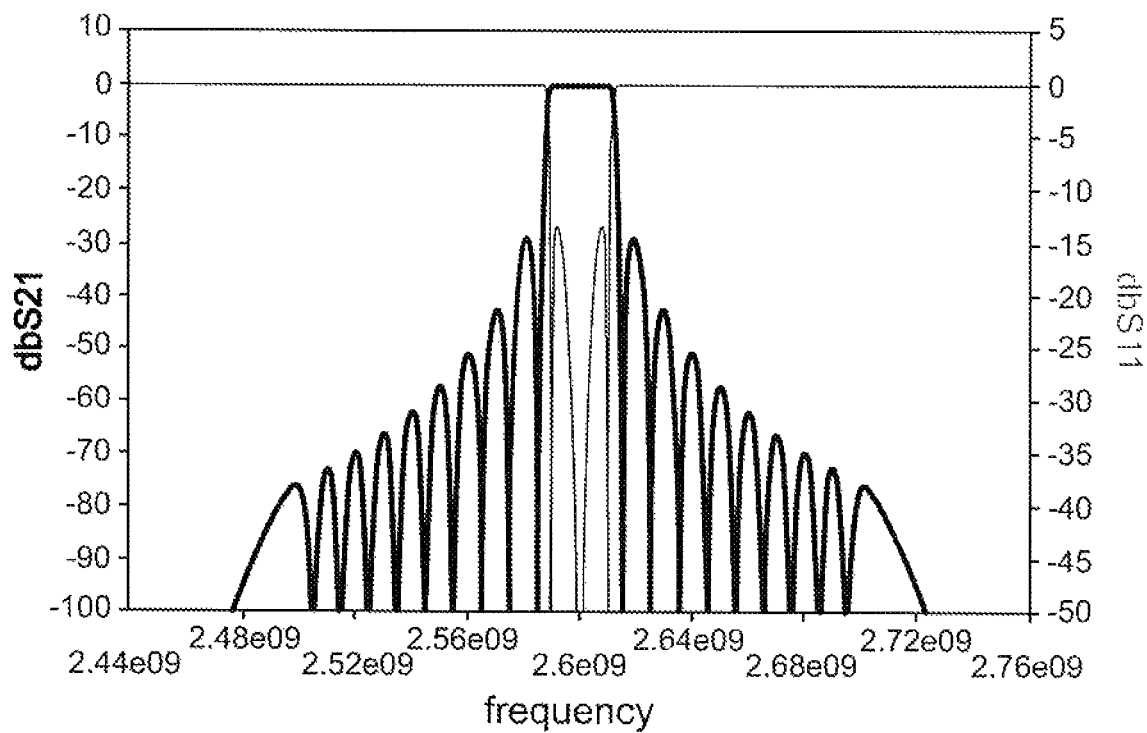
Figure 11B:
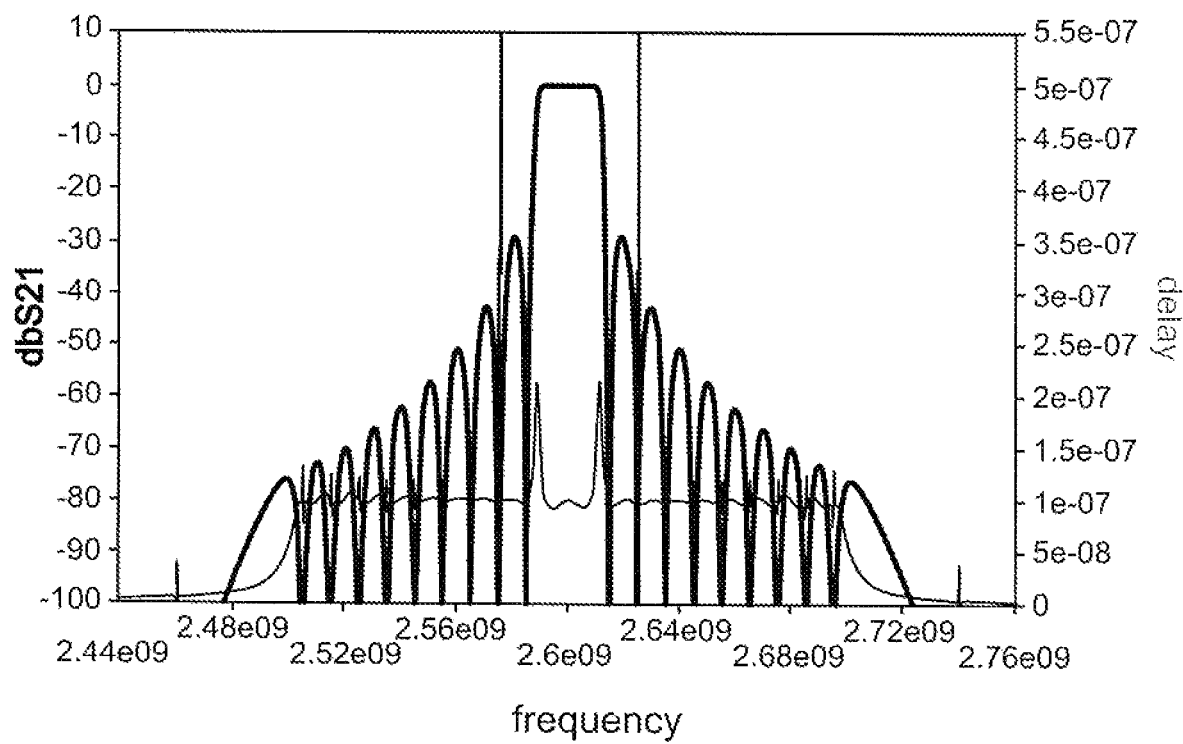
Figure 12A:
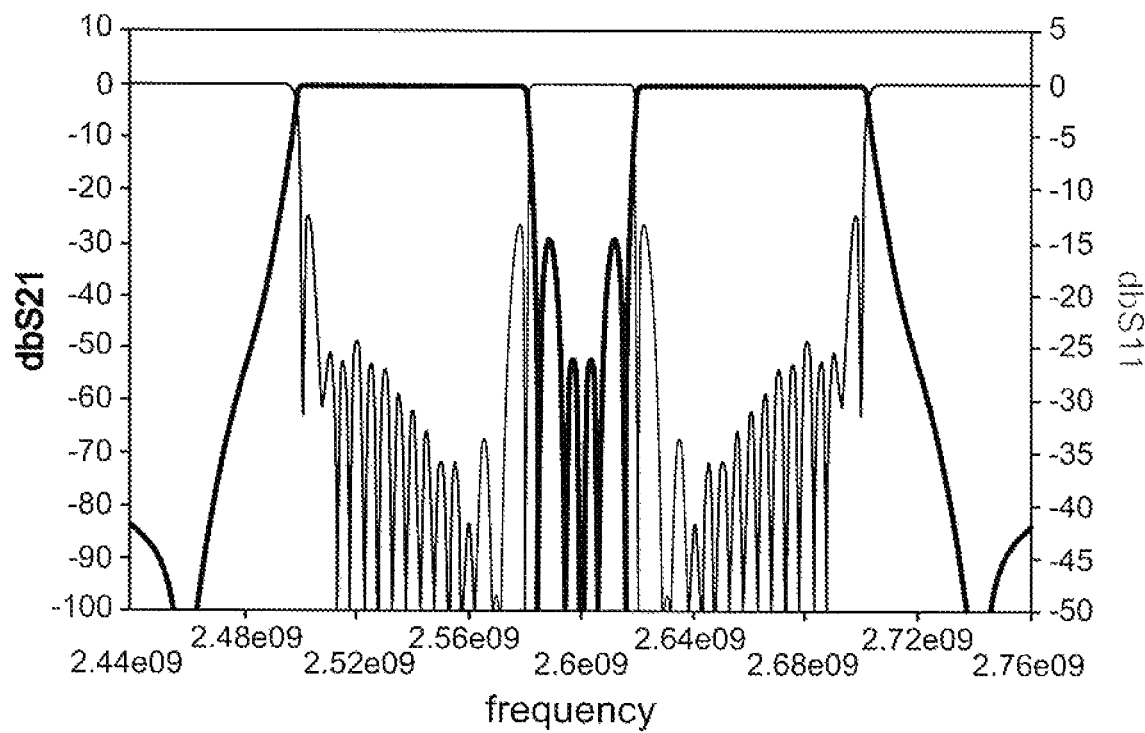
FIG. 12a shows the insertion loss and return loss for the multiplexer of FIG. 5a with four channels switched off.
Figure 12B:
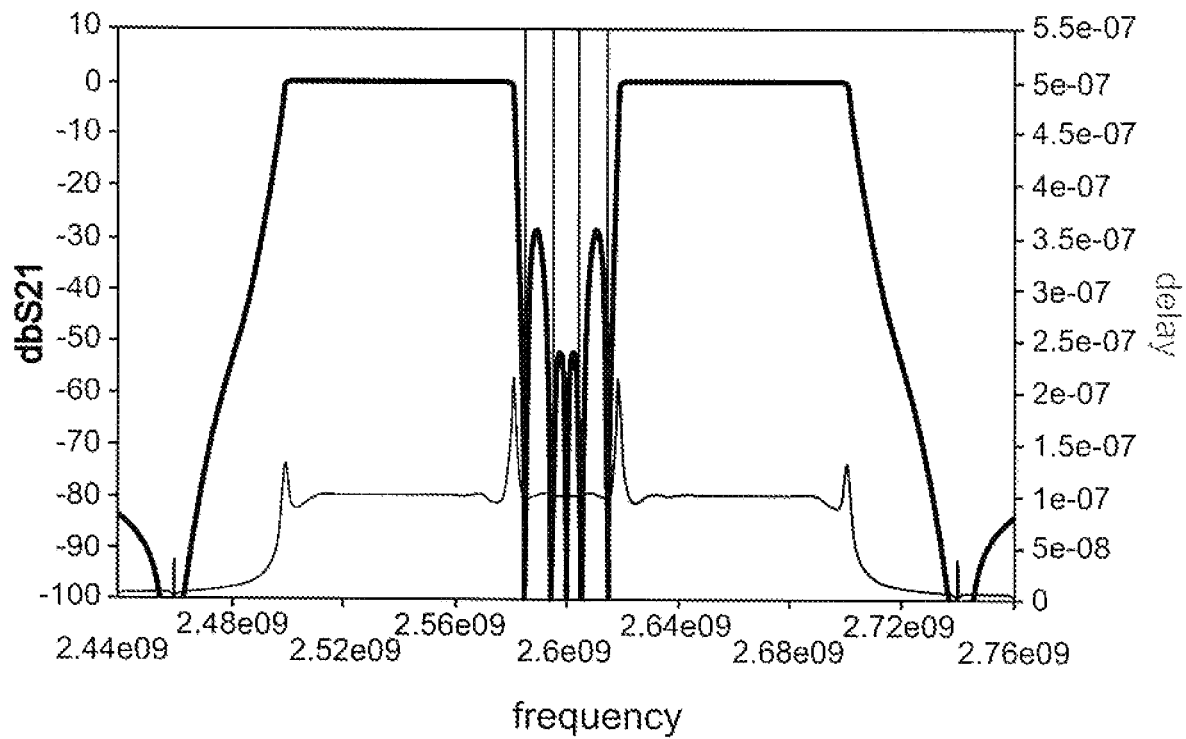
FIG. 12b shows the group delay for the multiplexer of FIG. 5a with four channels switched off.
Figure 13A:
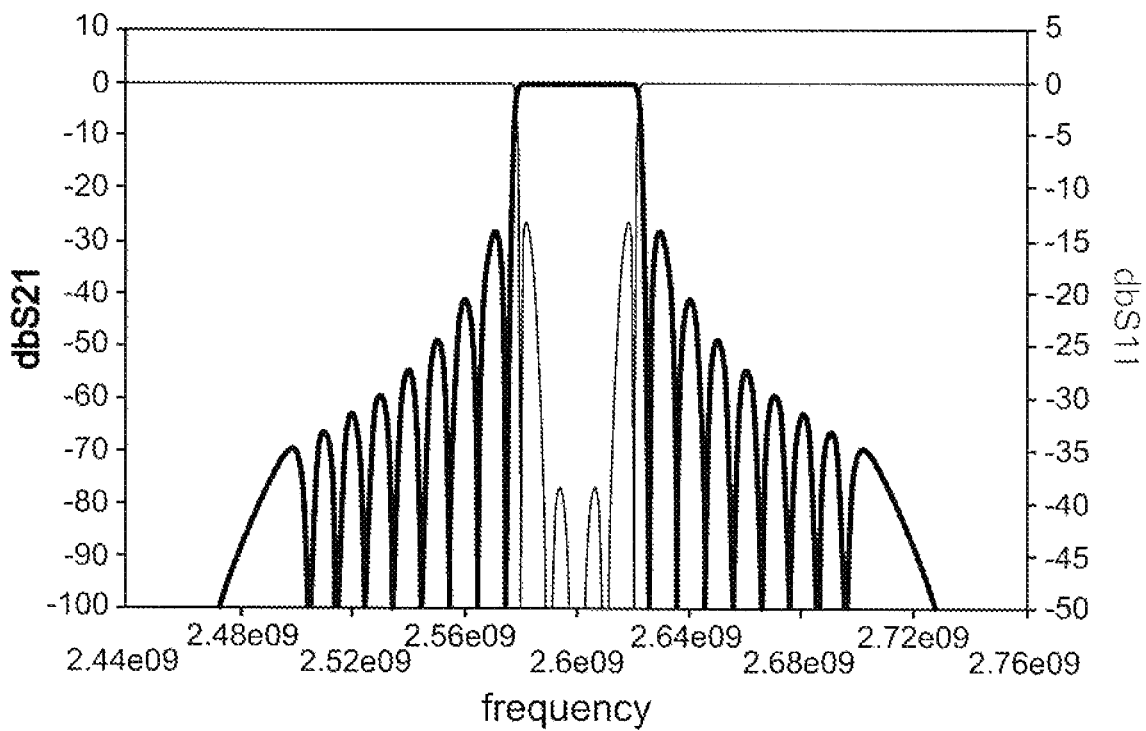
Figure 13B:
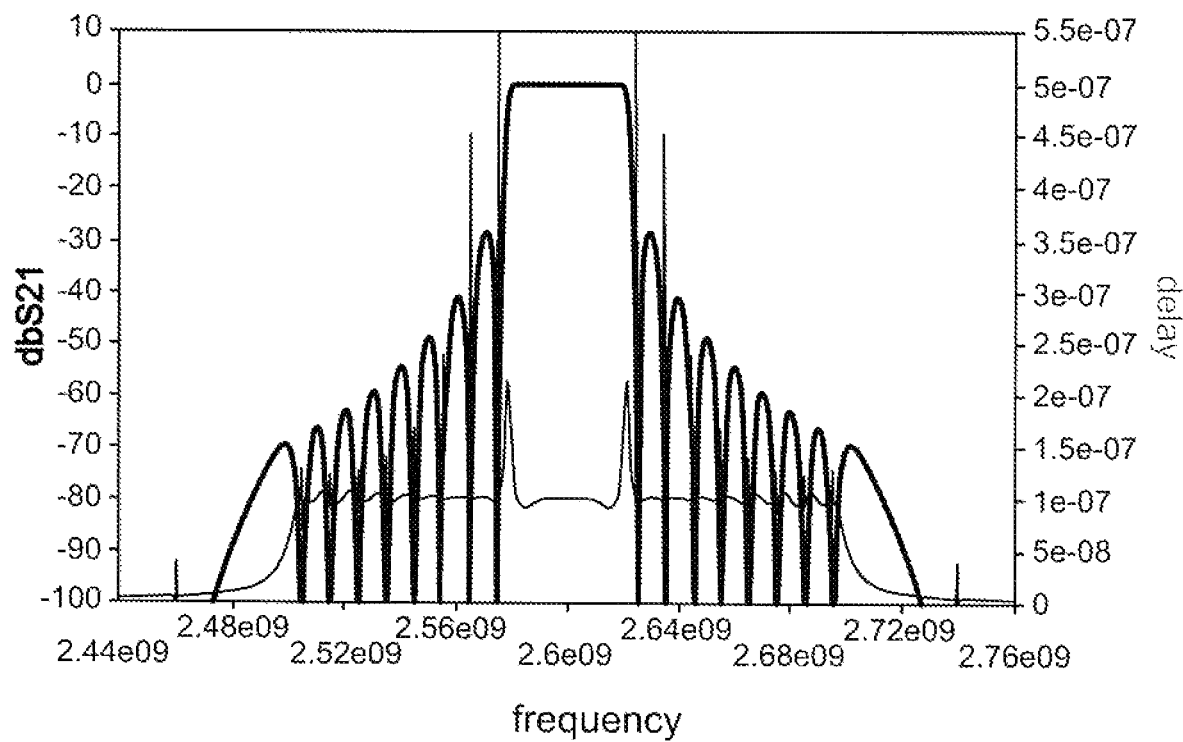

Hence $S_{11}(p)$ has a third order zero at $p=0$ and zeros at $p=+/-j$ as shown in FIG. 11a. The phase response of $S_{12}(p)$ is an equidistant approximation to linear phase at $P=0$, $+/-j,+/-j2$ and the corresponding group delay is shown in FIG. 11b.

Plots are also shown in FIGS. 12a, 12b, 13a and 13b for four channels off and on.

Figure 14A:
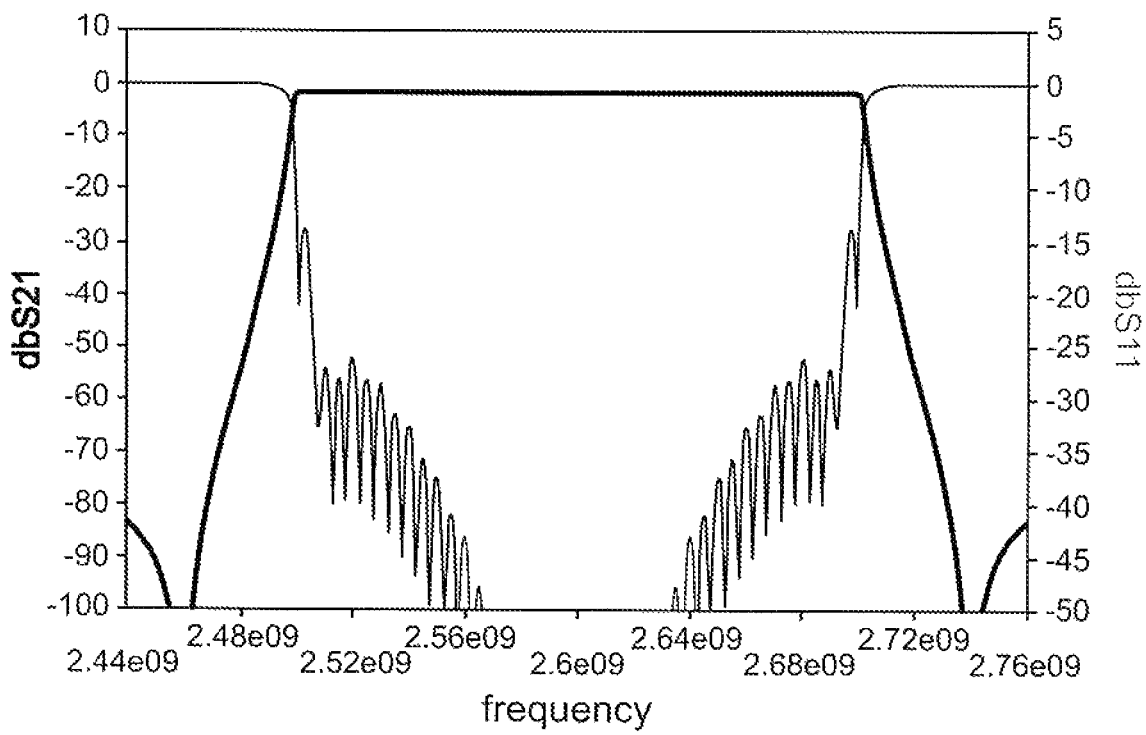
FIG. 14a shows the insertion loss and return loss for the multiplexer of FIG. 5a with all channels switched on and finite Q.
Figure 14B:
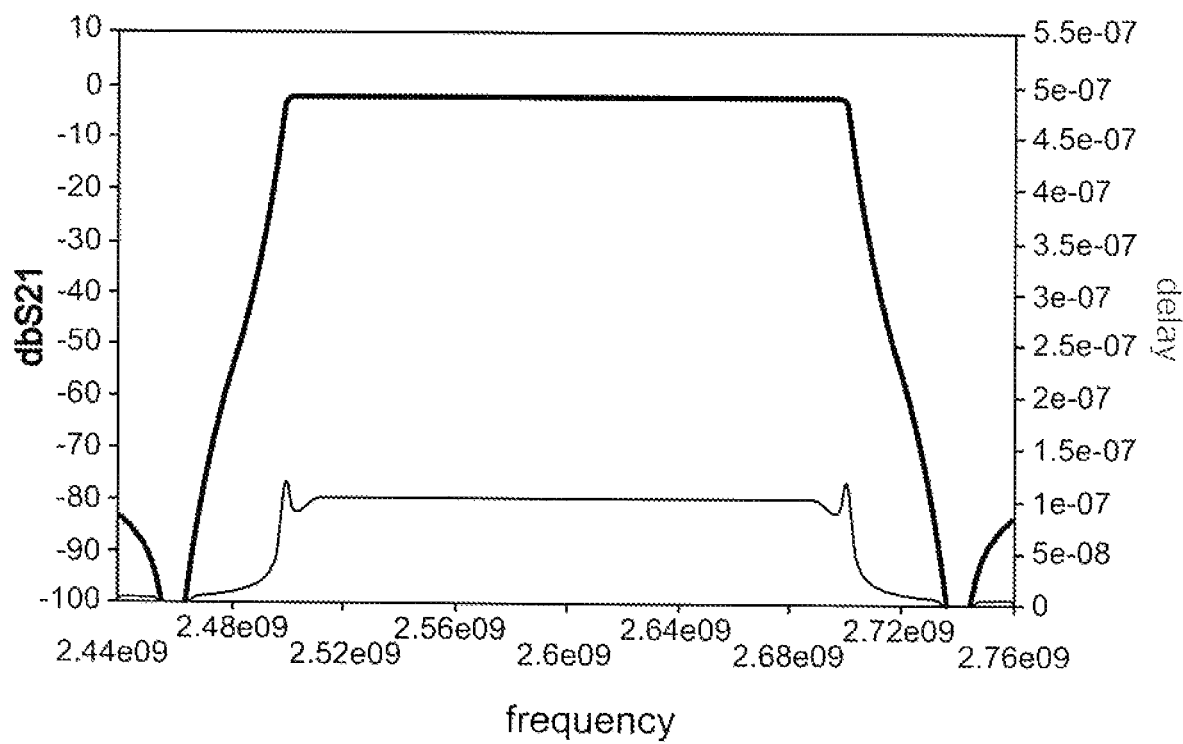
FIG. 14b shows the group delay for the multiplexer of FIG. 5a and the resonators having finite Q.

If finite dissipation loss (ie finite Q) is Introduced into the resonators of the signal channels then due to the good return loss and approximately constant delay the overall loss in the respective signal channel passbands will be very flat. This is illustrated in FIGS. 14a and 14b.

The above is included as theoretical background to help explain the behaviour of the microwave switched multiplexer 21 according to the invention.

Figure 15:
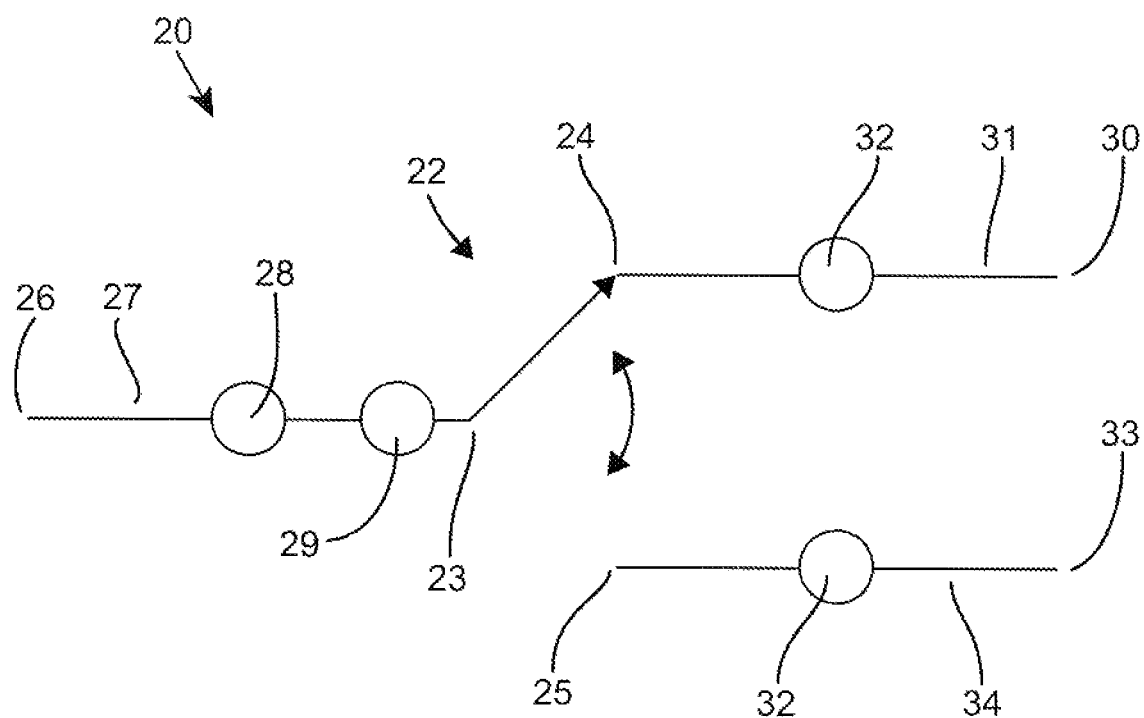
FIG. 15 shows a single signal channel of a microwave switched multiplexer according to the invention.

A single signal channel 20 of a microwave switched multiplexer 21 according to the invention is shown in FIG. 15. The signal channel 20 comprises a switch 22 having first 23, second 24 and third 25 ports. The switch 22 can be switched between three positions. In the first position (the transmit position) the first and second ports 23,24 are connected together such that a signal received at the first port 23 is passed to the second port 24 and vice versa. In the second position (the receive position) the first and third ports 23,25 are connected together such that a signal received at the first port 23 is passed to the third port 25 and vice versa. In the third position (the off position) none of the ports 23,24.25 are connected together. The switch is typically a GaAs, CMOS or MEMS switch.

Extending from the first port 23 to an antenna end 26 is a common line 27. The common line 27 comprises an input resonator 28 and a center resonator 29 connected together in cascade. The center resonator 29 is coupled between the input resonator 28 and the first port 23. The resonators 28,29 are typically thin film bulk acoustic resonators (FBAR resonators) or surface acoustic wave resonators (SAW resonators). Such resonators 28,29 are highly compact and so suitable for use in mobile handsets. The invention is not limited to such resonators and other resonators such as cavity resonators are possible.

Extending from the second port 24 of the switch 22 to a transmit end 30 is a transmit line 31. The transmit line 31 comprises an output resonator 32. When the switch 22 is in the transmit position the output resonator 32 is connected in cascade with the input and center resonators 28,29. When the switch 22 is not in the transmit position the output resonator 32 is not connected to the input and center resonators 28,29. Again, the output resonator is preferably an FBAR resonator or SAW resonator although other types of resonator are possible.

Extending from the third port 25 to a receive end 33 is a receive line 34. The receive line 34 comprises an output resonator 32. When the switch 22 is in the receive position the output resonator 32 is connected in cascade with the Input and center resonators 28,29. When the switch 22 is not in the receive position the output resonator is not connected to the input and center resonators 28,29. Again, the output resonator 32 is preferably an FBAR resonator or SAW resonator although other types of resonator are possible.

The two output resonators 32 are preferably identical. In particular they have the same admittance as each other.

The ratio of the admittances of the input resonator 28, center resonator 29 and output resonator 32 is $\pi/2{:}4/\pi{:}\pi/2$ with x in the range 0.9 to 1.1, more preferably 0.95 to 1.05, more preferably 0.97 to 1.03, more preferably 0.99 to 1.01. Preferably x is as close to 1 as possible. All resonators 28,29,32 within a single channel 20 have the same resonant frequency related to the center frequency for the signal bandpass for that channel 20.

Figure 16:
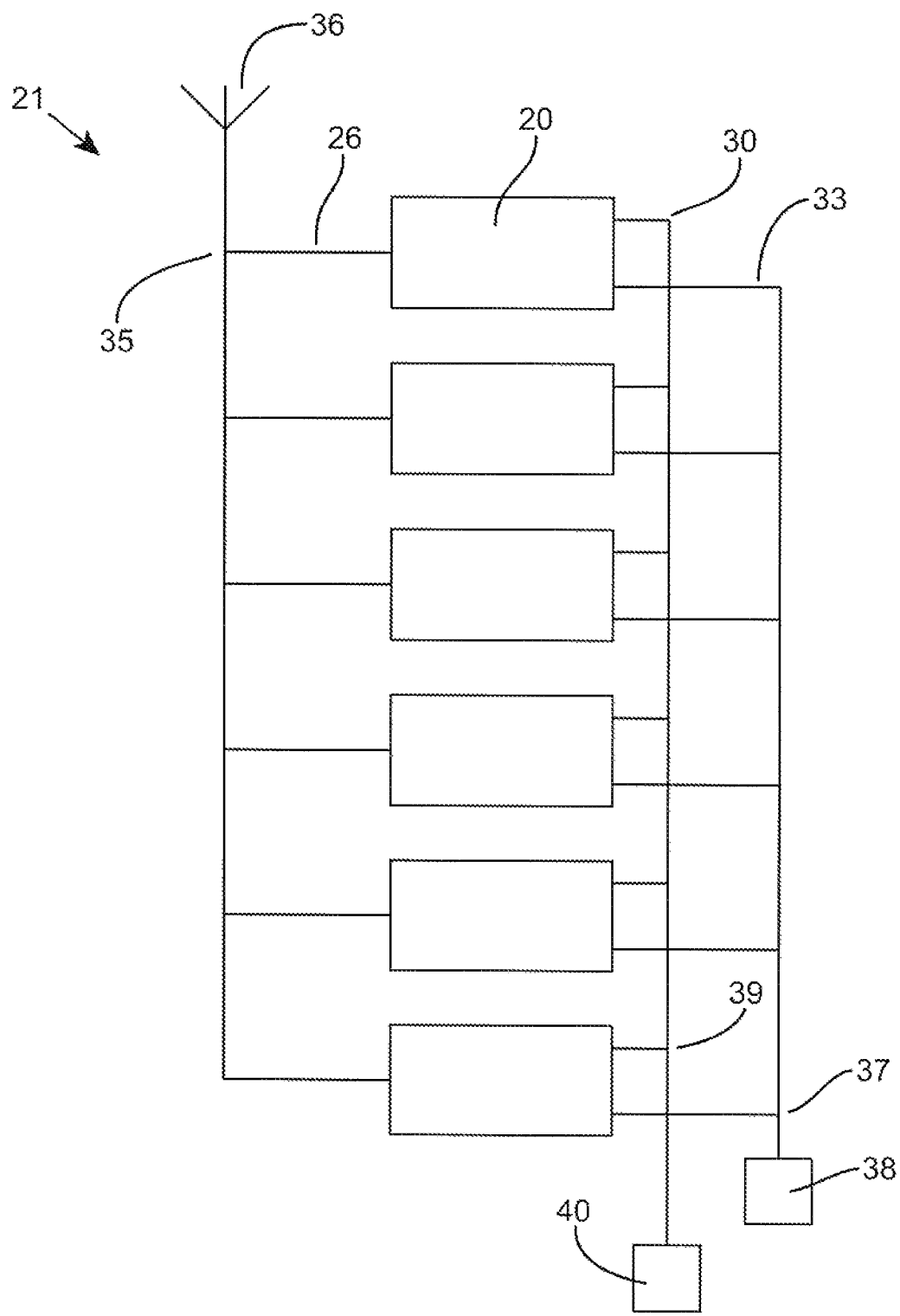
FIG. 16 shows an embodiment of a microwave switched multiplexer according to the invention.

Shown in FIG. 16 is a microwave switched multiplexer 21 according to the invention having n signal channels 20. Each signal channel 20 is shown as a block with the antenna 26, receive 33 and transmit 30 ends extending from the block 20. The microwave switched multiplexer 21 has a bandpass $\Delta f$ between frequencies $f_1$ and $f_2$, with $\Delta f = f_1 - f_2$. Each signal channel 20 has a signal bandpass at a center frequency within $\Delta f$. Each signal channel 20 has a different center frequency. For each signal channel 20 the resonant frequencies of the input, center and output resonators 28,29,32 are set such that the center frequencies of the signal channels 20 are equally spaced apart by $\Delta f/n$, such that they cover the entire bandpass of the microwave switched multiplexer 21.

Figure 17:
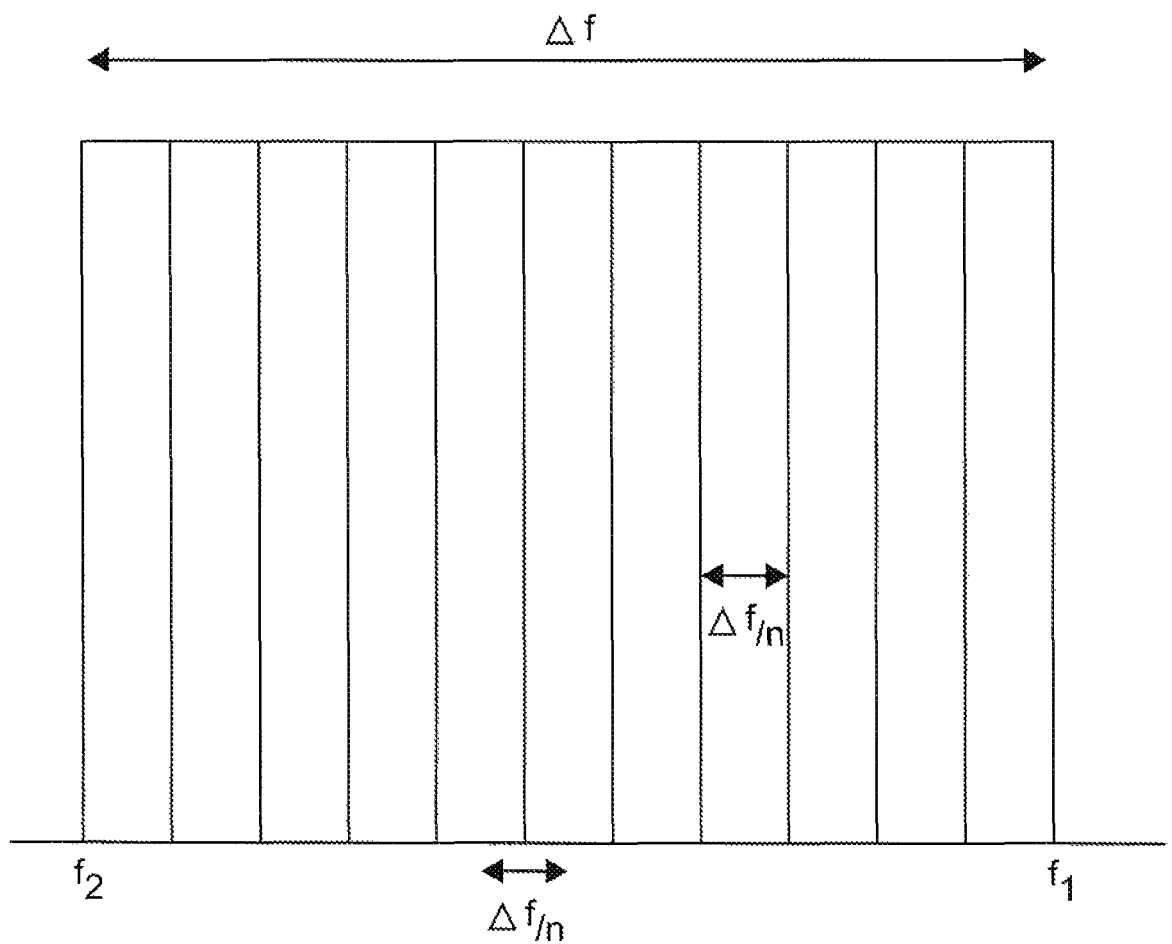
FIG. 17 shows in schematic form the signal channels of a microwave switched multiplexer according to the invention.

Corresponding resonators 28,29,32 in different signal channels 20 have the same admittance values ie all the input resonators 28 have the same admittance values, all the center resonators 29 have the same admittance values and all the output resonators 32 have the same admittance values. As the absolute values of the admittances of these resonators 28,29,32 is changed (whilst keeping the ratios of the admittances constant within the range specified above) the width of the signal bandpass of each channel 20 changes. The absolute values of these admittances are set such that the width of the signal bandpass for each signal channel 20 is substantially Δf/n. Between them the signal bandpasses of the signal channels 20 cover the entire bandpass of the microwave switched multiplexer 21. This is shown schematically in FIG. 17. An alternative way of expressing this is that the absolute values of the admittances of the input, center and output resonators 28,29,32 are set such that the signal bandpasses for the signal channels 20 are substantially contiguous.

Each antenna end 26 is connected to an antenna node 35. A common antenna 36 is connected to the antenna node 35. Each receive end 33 is connected to a common receive node 37. A microwave receiver 38 is connected to the receive node 37. Each transmit end 30 is connected to a common transmit node 39. A microwave transmitter 40 adapted to provide a microwave signal within the bandpass of the microwave switched multiplexer 21 is connected to the transmit node 39.

Figure 18A:
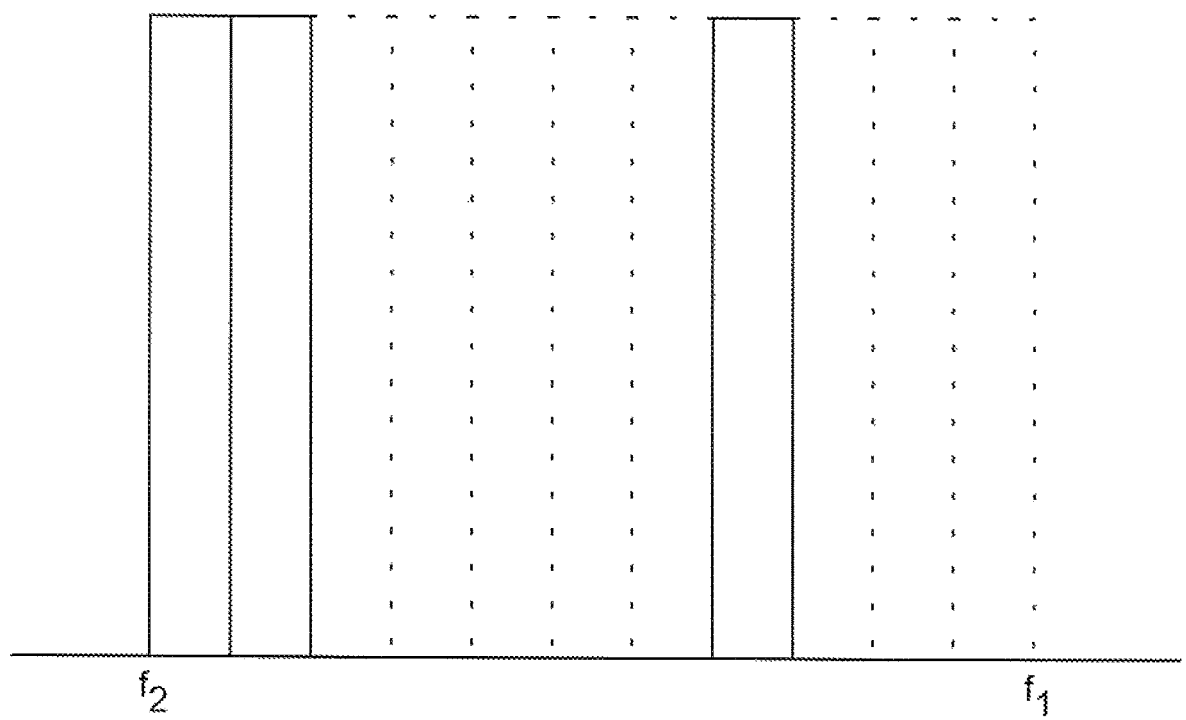
FIG. 18a and 18b show the signal channels ofFIG. 17 configured to produce transmit and receive frequency bands.
Figure 18B:
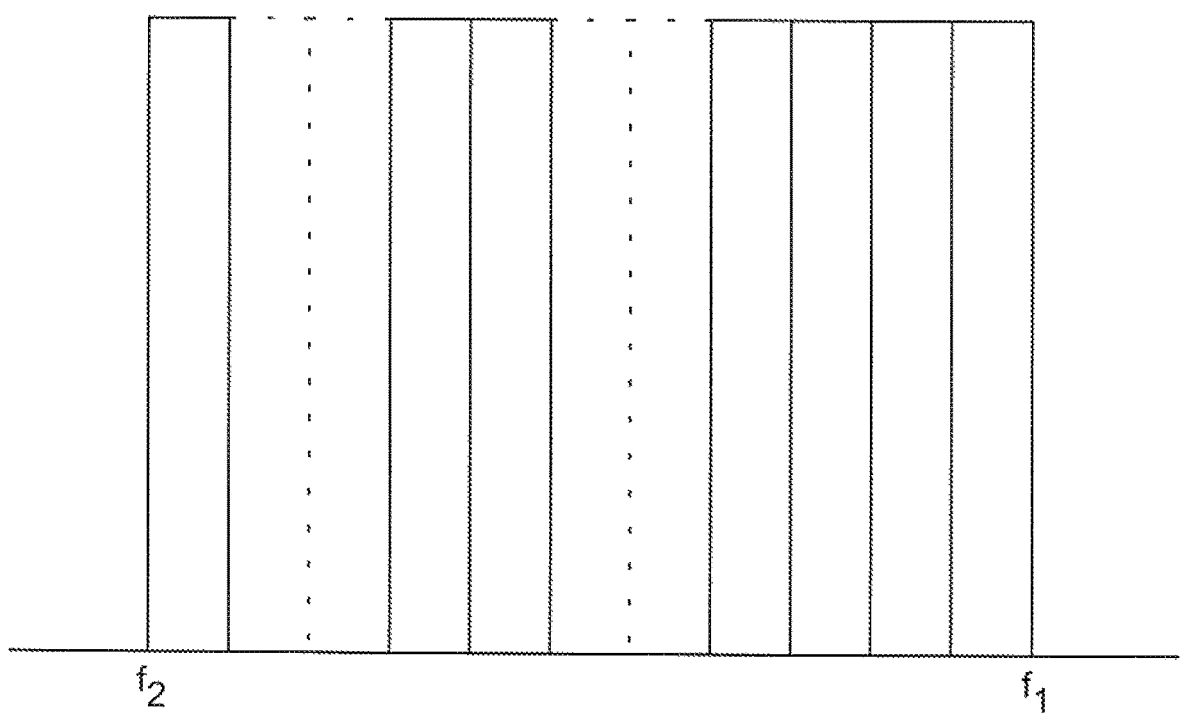

Connected to each of the switches 22 is a controller (not shown). The controller programmatically sets the position of each switch 22. By suitably setting the switches 22 one can produce a microwave switched multiplexer 21 with any desired arrangement of transmit and receive frequency bands within the bandpass of the microwave switched multiplexer 21 with each transmit or receive frequency band made up of the signal bandpasses of one or more signal channels 20. This is shown schematically in FIGS. 18a and 18b. The bandpasses of signal channels 20 in the off state are shown dotted.

The microwave switched multiplexer 21 according to the invention has a number of advantages. Firstly, one does not require a separate diplexer for each frequency band. The multiplexer 21 comprises a fixed number of signal channels 20 which can be configured to produce any desired configuration of transmit and receive frequency bands. No complex switching is required. All that is required is a single simple switch 22 for each signal channel 20. Most significantly if one sets two (or more) adjacent signal channels 20 to be in the same state (ie either receive or transmit) an aggregated band is produced having a bandpass width equal to the sum of the signal bandpass widths of the signal channels 20. Unlike in the prior art this aggregated band has constant group delay and loss across the aggregated band. In particular there is no increase in loss and/or group delay at the crossover point of the signal bandpasses of adjacent signal channels 20 making up the aggregated band.

Figure 19A:
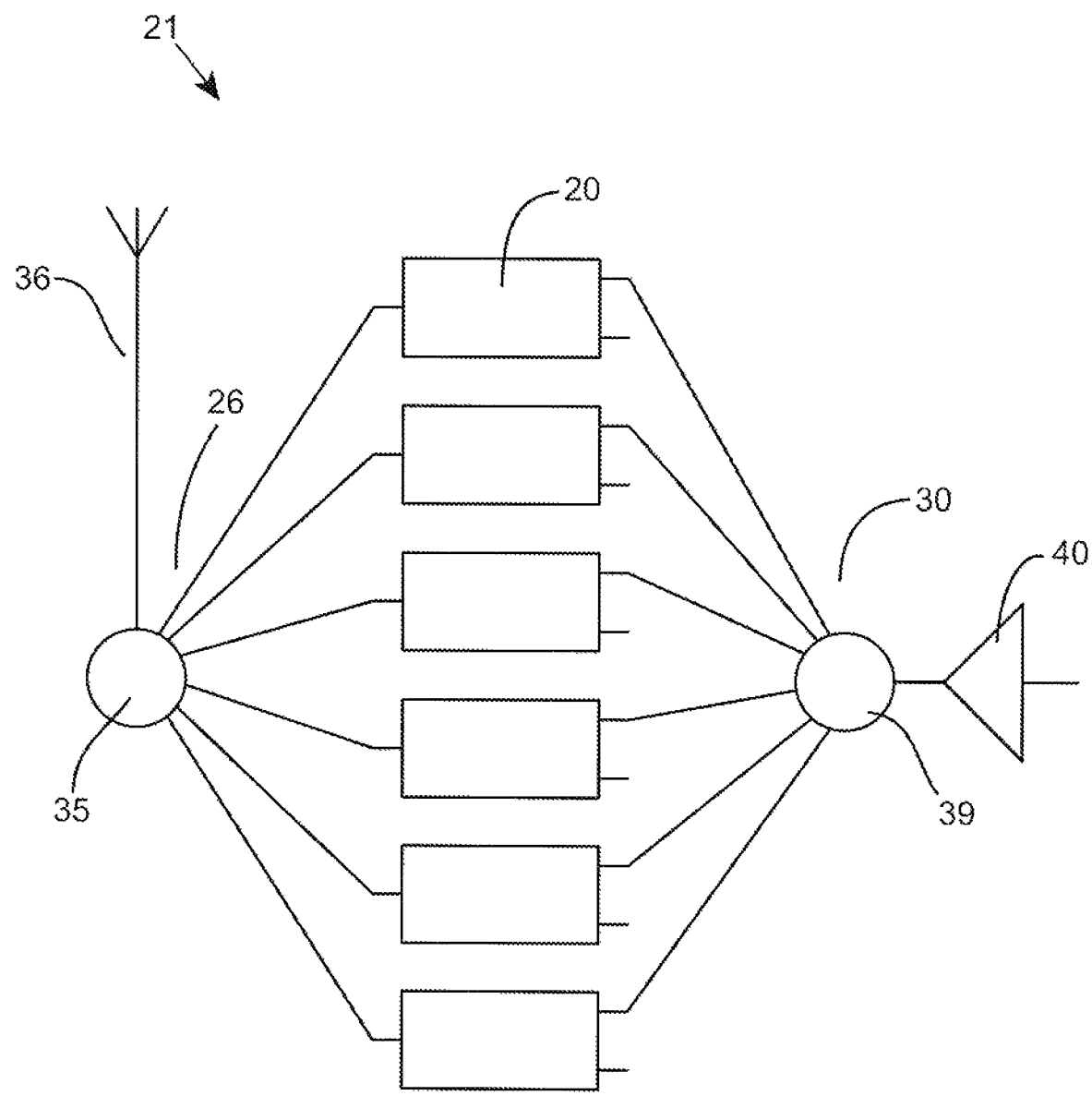
FIG. 19a and 19b show a further embodiment of a microwave switched multiplexer according to the invention.
Figure 19B:
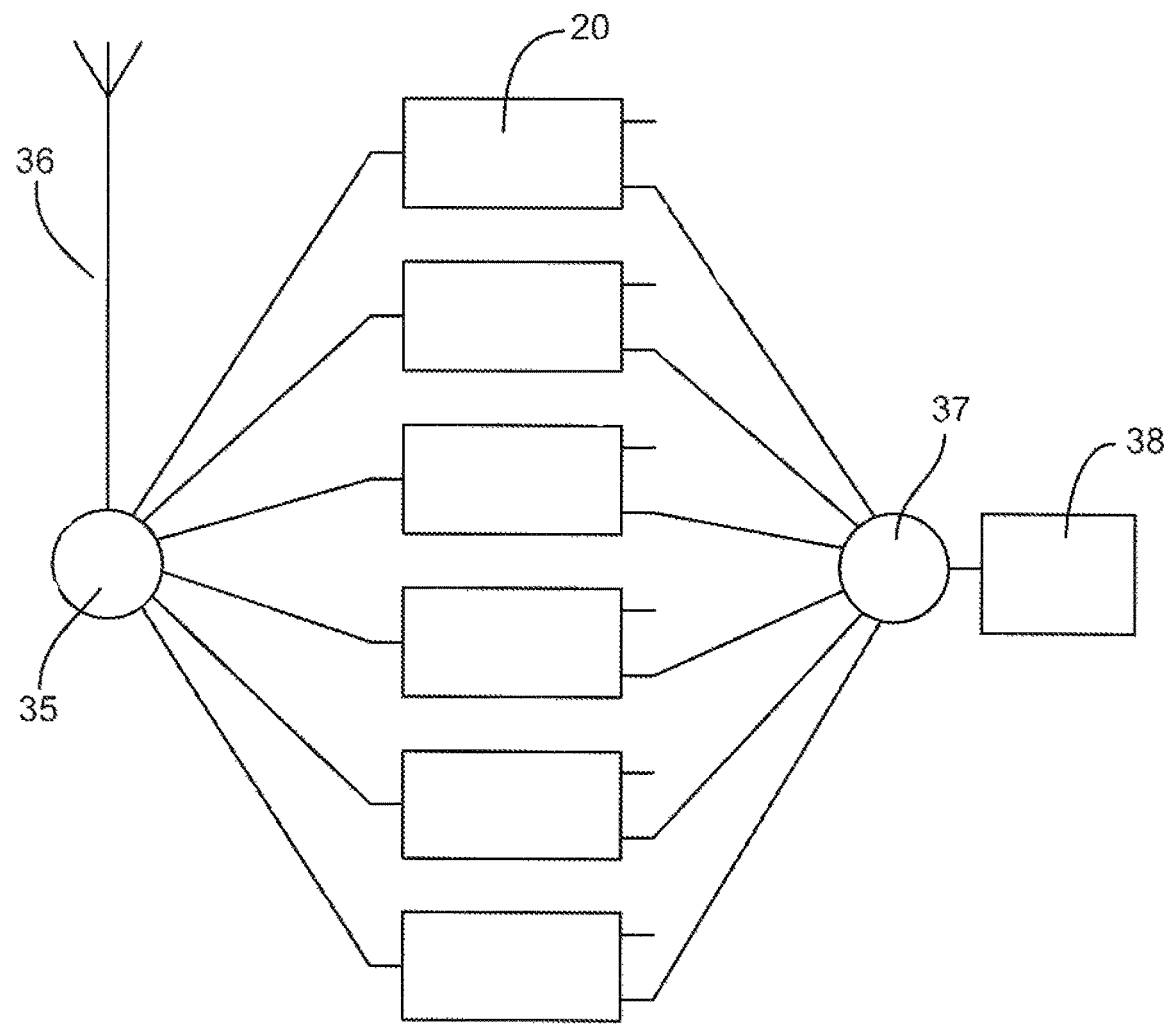

Whilst the above embodiment of a microwave switched multiplexer 21 according to the invention is a significant improvement over known microwave switched multiplexer it can be difficult to couple to the multiplexer 21 across the entire passband without significant loss. Shown in FIGS. 19(a) and 19(b) is an alternative embodiment of a microwave switched multiplexer 21 according to the invention which overcomes this problem.

In this embodiment the antenna node 35 is an antenna resonator 35. The antenna ends 26 of each of the signal channels 20 are coupled to the antenna resonator 35 such that the antenna resonator 35 is connected in cascade with each of the input resonators 28. The antenna 36 is also coupled to the antenna resonator 35. Signals pass from the signal channels 20, through the antenna resonator 35 to the antenna 36 (and vice versa). Again, the antenna resonator 35 is typically a SAW resonator or FBAR resonator although other types of resonator are possible.

If the microwave switched multiplexer 21 had an infinite number of signal channels 20 and infinite bandwidth the antenna resonator 35 would not be required One would be able to couple to the microwave switched multiplexer 21 across the entire passband with only minimal insertion less. The microwave switched multiplexer 21 according to the invention however has only a finite number of signal channels 20 and finite bandpass. The antenna resonator 35 compensates for the absence of the infinite number of signal channels which have signal bandpasses outside the bandpass of the multiplexer 21, allowing one to couple to the multiplexer 21 without significant loss across the bandpass of the multiplexer 21.

In order to achieve this compensation the ratio of the admittance of the antenna resonator 35 to the input resonator 28 is y/n:π/2, where y is in the range 0.5 to 1.5, more preferably 0.8 to 1.2, more preferably 0.9 to 1.1, more preferably 0.95 to 1.05.

Similarly, in this embodiment the transmitter node 39 is a transmitter resonator 39 coupled in cascade with the output resonators 32 of the transmit line 31. Signals from the transmitter 40 pass though the transmitter resonator 39 to the signal channels 20 and vice versa. The ratio of the admittance of the transmitter resonator 39 to the output resonator is y/n:π/2, where y is in the range 0.5 to 1.5, more preferably 0.8 to 1.2, more preferably 0.9 to 1.1, more preferably 0.95 to 1.05.

Similarly, in this embodiment the receiver node 37 is a receiver resonator 37 coupled in cascade with the output resonators 32 of the receive line 34. Signals from the signal channels 20 pass though the receiver resonator 37 to the receiver 38. The ratio of the admittance of the receiver resonator 37 to the output resonator is y/n:π/2, where y is in the range 0.5 to 1.5, more preferably 0.8 to 1.2, more preferably 0.9 to 1.1, more preferably 0.95 to 1.05.

Ideally the transmitter resonator 39, receiver resonator 37 and antenna resonator 35 all have the same admittance values.

FIG. 19(a) shows the transmitter resonator 39 and associated connections. FIG. 19(b) shows the receiver resonator 37 and associated connections. These are not shown in the same figure for clarity.

Figure 20:
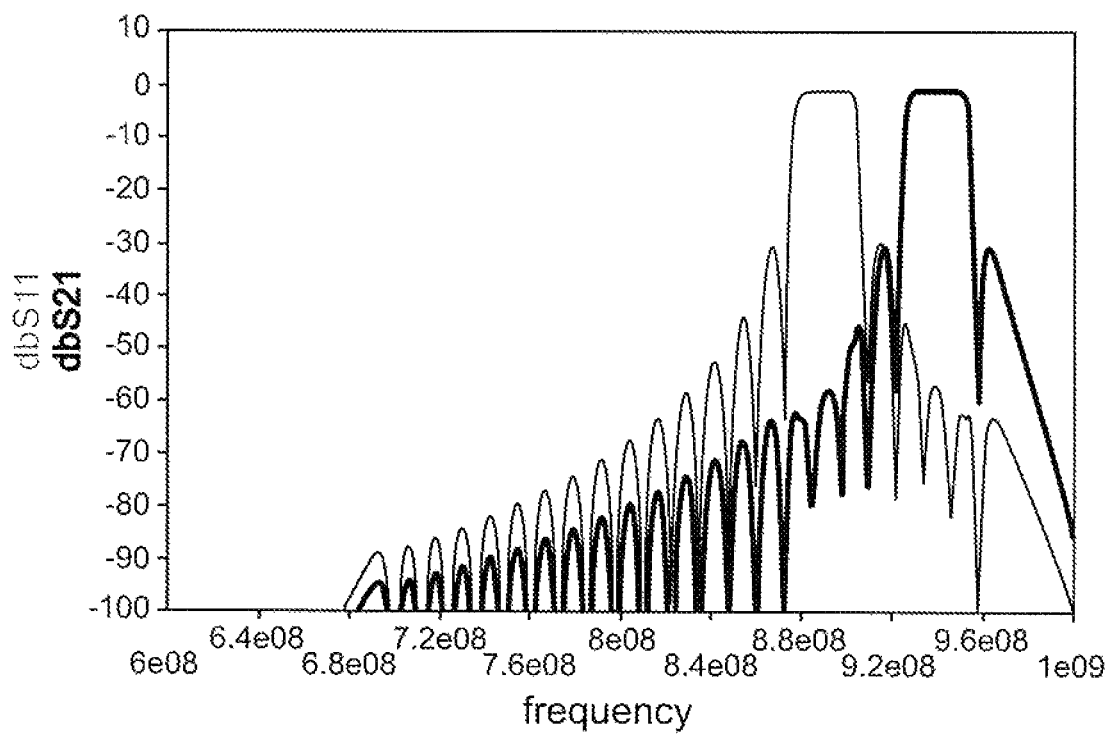
FIG. 20 shows insertion loss for a muliplexer of FIGS. 19a and 19b configured to have a transmission band and a receive band.

FIG. 20 shows the insertion toss as a function of frequency for a microwave switched multiplexer 21 according to the invention as shown in FIGS. 19a and 19b. The multiplexer 21 has twenty two signal channels 20 each having a signal bandpass of width 12.5 MHz and each separated from the next by 12.5 MHz. The signal bandpasses of the signal channels 20 are therefore substantially contiguous and cover the bandpass of the multiplexer 21 from about 700 and 960 MHz. The ratio of the admittance of the input, center and output resonators 28,29,32 are π/2:4/π:π/2. The ratio of the admittance of the antenna resonator 35 to the input resonator 28 is π/n; π/2 where n is the number of channels. The transmitter resonator 39 and receiver resonator 37 each have the same admittance as the antenna resonator 35.

In this embodiment two adjacent signal channels 20 are configured in the transmit state such that their signal bandpasses form an aggregated transmission band. Two adjacent signal channels 20 are configured in the receive state such that their signal bandpasses form an aggregated receive band. As can be seen for both the aggregated transmit and receive bands there is no change in insertion loss at the cross over point of the bandpasses of the signal channels 20 making up the bands. Further, there is no change in group delay at this point.

Figure 21:
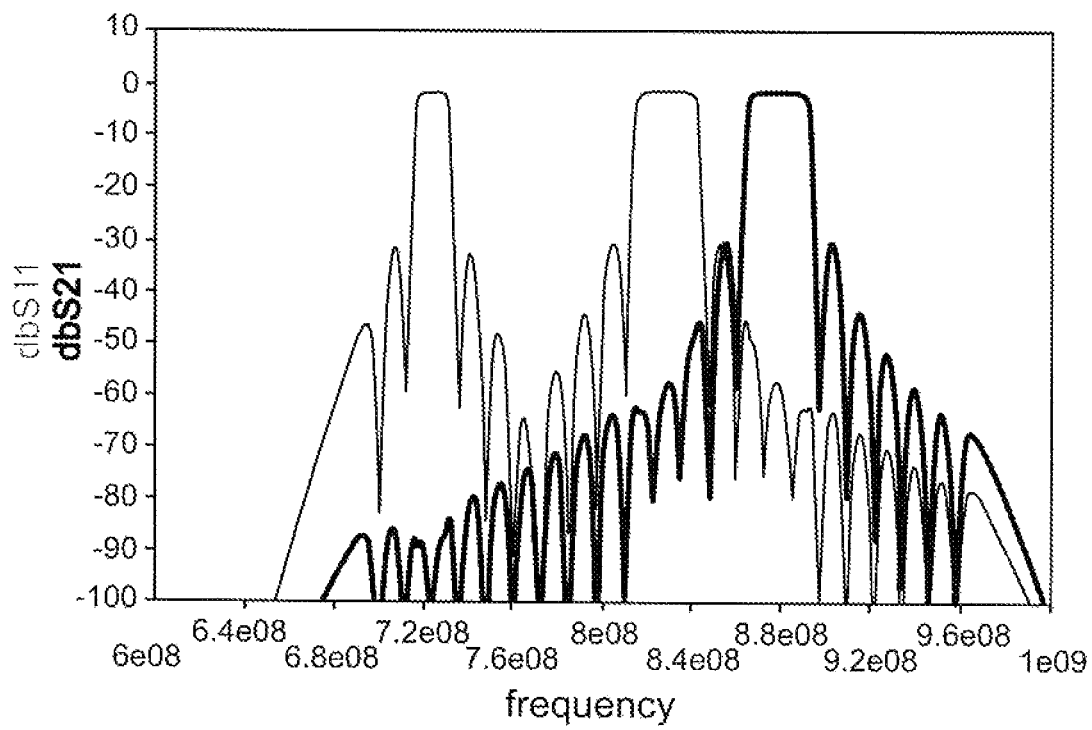
FIG. 21 shows the insertion loss for a multiplexer of FIGS. 19a and 19b configured to have a plurality of transmission and receive bands.

FIG. 21 is similar to that of FIG. 2C. The signal channels 20 of the microwave switched multiplexer 21 are configured to provide one aggregate transmission band and two receive bands. One receive band comprises the signal bandpass of a single signal channel 20. The other receive band comprises the signal bandpasses of two adjacent signal channels producing an aggregated receive band.

Figure 22:
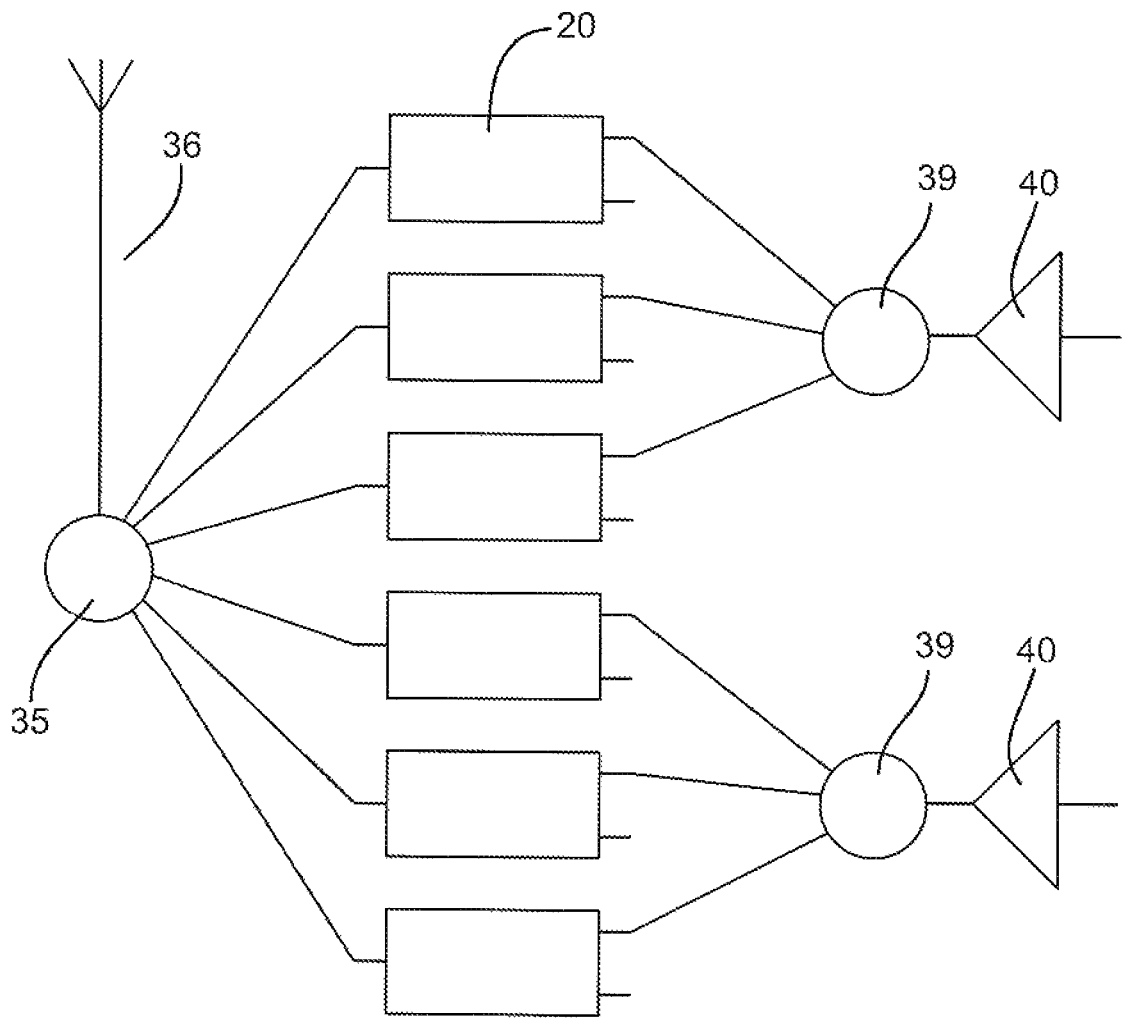
FIG. 22 shows a further embodiment of a microwave switched multiplexer according to the invention; and, FIG. 23 shows insertion loss and return loss for a signal channel in schematic form.

FIG. 22 shows a further embodiment of a microwave switched multiplexer 21 according to the invention. In this embodiment for a first subset 20 of the signal channels the receive ends are connected to a common receive node and the transmit ends 30 are connected to a common transmit node 39. The antenna ends are connected to a common antenna node 35. A second subset of the signal channels 20 are configured in the same way. Both subsets are connected to the same antenna node 35. Only the common transmit nodes 39 are shown for clarity.

Figure 23:
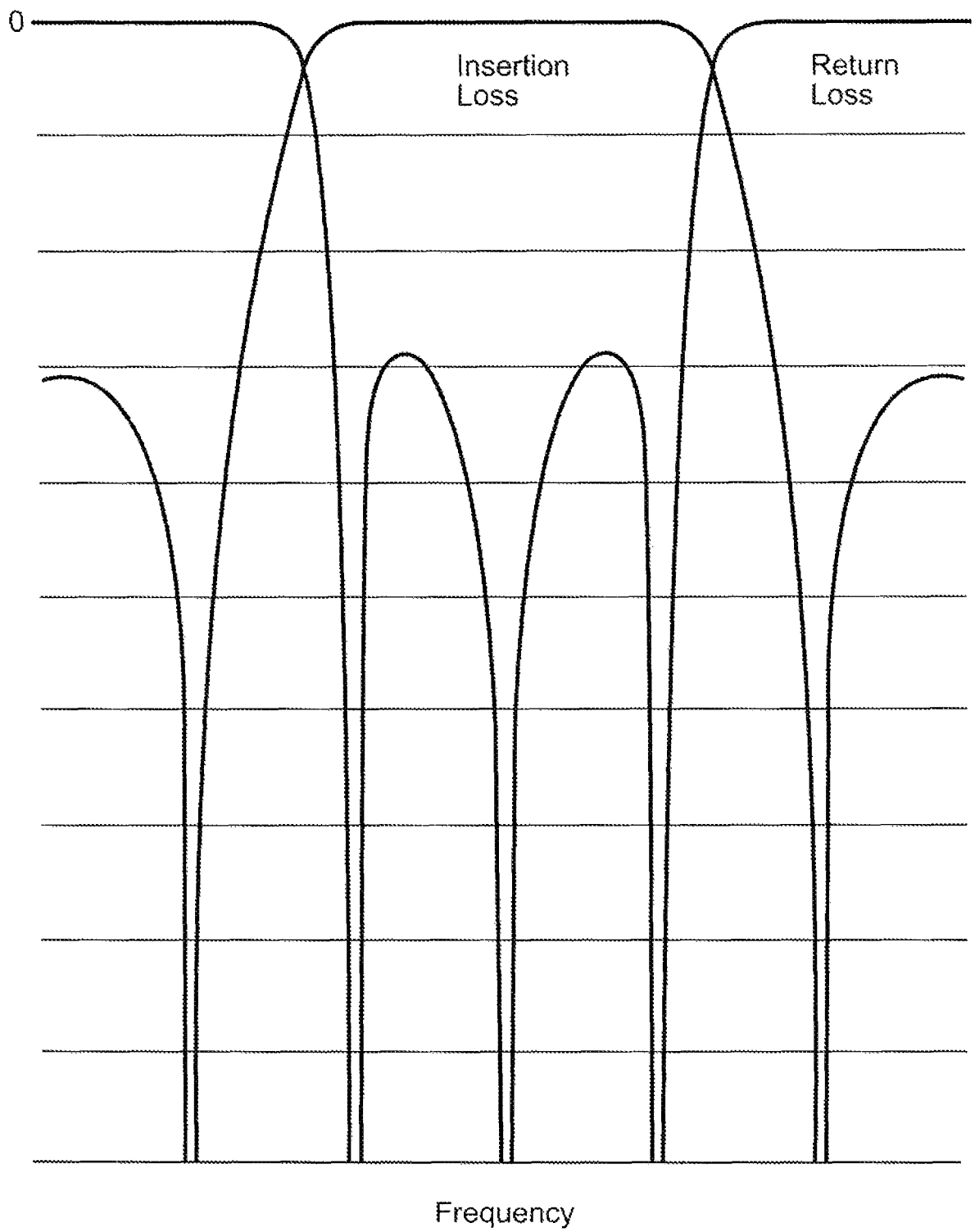

Throughout the above description reference is made to the width of the bandpass of a signal channel 20. As the signal channels interact this is measured with only one signal channel 20 switched on and all other signal channels 20 switched off. FIG. 23 shows, in schematic form, insertion loss and return loss for single signal channel 20 within and close to the edges of the signal bandpass. As can be seen, at the center of the bandpass there Is an infinity in the return loss. At each edge of the signal bandpass there is a further infinity in the return loss. The width of the signal bandpass is the difference in frequency between these two edge infinities.

The invention claimed is:

1. A microwave switched multiplexer having a bandpass $\Delta f$ between frequencies $f_1$ and $f_2$, $\Delta f = f_1 - f_2$, the multiplexer comprising:
   n signal channels, where n>1, each signal channel having a signal bandpass at a center frequency within $\Delta f$; the center frequencies of the signal channels being equally spaced apart by $\Delta f/n$;
   each signal channel comprising:
   (a) a switch having first, second and third ports, the switch being adapted to be switched between a transmit position in which the first port is connected to the second port, a receive position in which the first port is connected to the third port and an off position in which the first port is not connected to either second or third ports;
   (b) a common line extending from an antenna end to the first port, the common line comprising an input resonator and a center resonator connected together in cascade, the center resonator being coupled between the input resonator and the first port;
   (c) a transmit line extending between the second port and a transmit end, the transmit line comprising an output resonator, the output resonator being connected in cascade with the input and center resonators when the switch is in the transmit position;
   (d) a receive line extending between the third port and a receive end, the receive line comprising an output resonator, the output resonator being connected in cascade with the input and center resonators when the switch is in the receive position;
   the admittances of the two output resonators being equal;
   the admittance of the input resonator, center resonator and output resonator being in the ratio
   where x is in the range 0.9 to 1.1
   wherein for at least two signal channels adjacent in frequency the antenna ends are connected to a common antenna node and at least one of (a) the receive ends are connected to a common receive node or (b) the transmit ends are connected to a common transmit node; and
   the admittances of the input, center and output resonators having absolute values such that for every signal channel when the switch for that channel is in the transmit or receive position and the switches for all other channels are in the off position, the width of the signal bandpass of the signal channel is substantially $\Delta f/n$.

2. A microwave switched multiplexer as claimed in claim 1, wherein for the at least two signal channels the receive ends are connected to a common receive node and the transmit ends are connected to a common transmit node.

3. A microwave switched multiplexer as claimed in claim 1, wherein for every signal channel the antenna ends are connected to a common antenna node, the transmit ends are connected to a common transmit node and the receive ends are connected to a common receive node.

4. A microwave switched multiplexer as claimed in claim 1, wherein x is in the range 0.95 to 1.05.

5. A microwave switched multiplexer as claimed in claim 1, wherein at least one of input, center and output resonators is an FBAR or SAW resonator.

6. A microwave switched multiplexer as claimed in claim 1, wherein the antenna node is connected to antenna.

7. A microwave switched multiplexer as claimed in claim 1, wherein the antenna node comprises an antenna resonator.

8. A microwave switched multiplexer as claimed in claim 7, wherein the ratio of the admittance of the antenna resonator to the input resonator is $y/n:\pi/2$
   where y is in the range 0.5 to 1.5.

9. A microwave switched multiplexer as claimed in claim 8, wherein y is in the range 0.8 to 1.2.

10. A microwave switched multiplexer as claimed in claim 8, wherein y is in the range 0.9 to 1.1.

11. A microwave switched multiplexer as claimed in claim 1, wherein the transmit node is connected to a transmitter, the transmitter being adapted to provide a microwave signal between frequencies $f_1$ and $f_2$.

12. A microwave switched multiplexer as claimed in claim 1, wherein the transmit node comprises a transmitter resonator, the ratio of the admittances of the transmitter resonator to the output resonator being $y/n:\pi/2$
   where y is in the range 0.5 to 1.5.

13. A microwave switched multiplexer as claimed in claim 12, wherein y is in the range 0.8 to 1.2.

14. A microwave switched multiplexer as claimed in claim 12, wherein y is in the range 0.9 to 1.1.

15. A microwave switched multiplexer as claimed in claim 1, wherein the receive node comprises a receiver resonator, the ratio of the admittance of the receiver resonator to the output resonator being
   $y/n:\pi/2$
   where y is in the range 0.5 to 1.5.

16. A microwave switched multiplexer as claimed in claim 15, wherein y is in the range 0.5 to 1.2.

17. A microwave switched multiplexer as claimed in claim 15, wherein y is in the range 0.9 to 1.1.

18. A microwave switched multiplexer as claimed in claim 1, further comprising a controller connected to the switches for switching the switches between states.

19. A microwave switched multiplexer as claimed in claim 1, wherein x is in the range 0.97 to 1.03.

20. A mobile telecommunications device comprising:
   at least one microwave switched multiplexer having a bandpass $\Delta f$ between frequencies $f_1$ and $f_2$, $\Delta f = f_1 - f_2$, the multiplexer comprising:
   n signal channels, where n>1, each signal channel having a signal bandpass at a center frequency within $\Delta f$; the center frequencies of the signal channels being equally spaced apart by $\Delta f/n$;
   each signal channel comprising:
   (a) a switch having first, second and third ports, the switch being adapted to be switched between a transmit position in which the first port is connected to the second port, a receive position in which the first port is connected to the third port and an off position in which the first port is not connected to either second or third ports;
   (b) a common line extending from an antenna end to the first port, the common line comprising an input resonator and a center resonator connected together in cascade, the center resonator being coupled between the input resonator and the first port;
   (c) a transmit line extending between the second port and a transmit end, the transmit line comprising an output resonator, the output resonator being connected in cascade with the input and center resonators when the switch is in the transmit position;
   (d) a receive line extending between the third port and a receive end, the receive line comprising an output resonator, the output resonator being connected in cascade with the input and center resonators when the switch is in the receive position;
   the admittances of the two output resonators being equal;
   the admittance of the input resonator, center resonator and output resonator being in the ratio where x is in the range 0.9 to 1.1
   wherein for at least two signal channels adjacent in frequency the antenna ends are connected to a common antenna node and at least one of (a) the receive ends are connected to a common receive node or (b) the transmit ends are connected to a common transmit node; and
   the admittances of the input, center and output resonators having absolute values such that for every signal channel when the switch for that channel is in the transmit or receive position and the switches for all other channels are in the off position, the width of the signal bandpass of the signal channel is substantially $\Delta f/n$.

* * * * *